(12) United States Patent
Sims, III

(10) Patent No.: US 6,388,512 B1
(45) Date of Patent: May 14, 2002

(54) PROCESS FOR A HIGH EFFICIENCY CLASS D MICROWAVE POWER AMPLIFIER OPERATING IN THE S-BAND

(75) Inventor: William Herbert Sims, III, Decatur, AL (US)

(73) Assignee: The United States of America as represented by the Administrator of National Aeronautics and Space Administration, Washington, DC (US)

( * ) Notice: Subject to any disclaimer, the term of this patent is extended or adjusted under 35 U.S.C. 154(b) by 48 days.

(21) Appl. No.: 09/707,290

(22) Filed: Nov. 3, 2000

(51) Int. Cl.$^7$ .............................................. G01R 19/00
(52) U.S. Cl. .......................... 330/2; 330/251; 330/295; 330/310
(58) Field of Search .......................... 330/2, 251, 286, 330/295, 310

(56) References Cited

U.S. PATENT DOCUMENTS 4,809,332 A * 2/1989 Jongman et al. .............. 381/43
5,831,476 A * 11/1998 Buer et al. ...................... 330/2
6,252,454 B1 * 6/2001 Thompson et al. ............ 330/9

* cited by examiner

Primary Examiner—Robert Pascal
Assistant Examiner—Henry Choe
(74) Attorney, Agent, or Firm—James J. McGroary

(57) ABSTRACT

A process and product providing a High Efficiency Microwave Power Amplifier (HEMPA) which propagates S-Band microwave frequency square waves; utilizing a program simulating FETs at high DC-to-RF efficiencies, which analyses linear elements of selected FETs in a frequency domain, and non-linear elements of the FETs in a time domain, and converts the time domain values into the frequency domain, and performs DC and S-parameter simulated measurements based on predefined data for each FET. Individual FET parameters are extracted and isolated by converting the S-parameters to admittance or impedance parameters to derive FET models for each FET, which the program uses to provide a final output of a HEMPA circuit based on iterative simulations of an amplification circuit utilizing microwave topology and frequencies. Iterative simulations of the amplification circuit analyze output values of a plurality of cascaded stages of the FETs, which are arranged in a push-pull configuration.

20 Claims, 23 Drawing Sheets

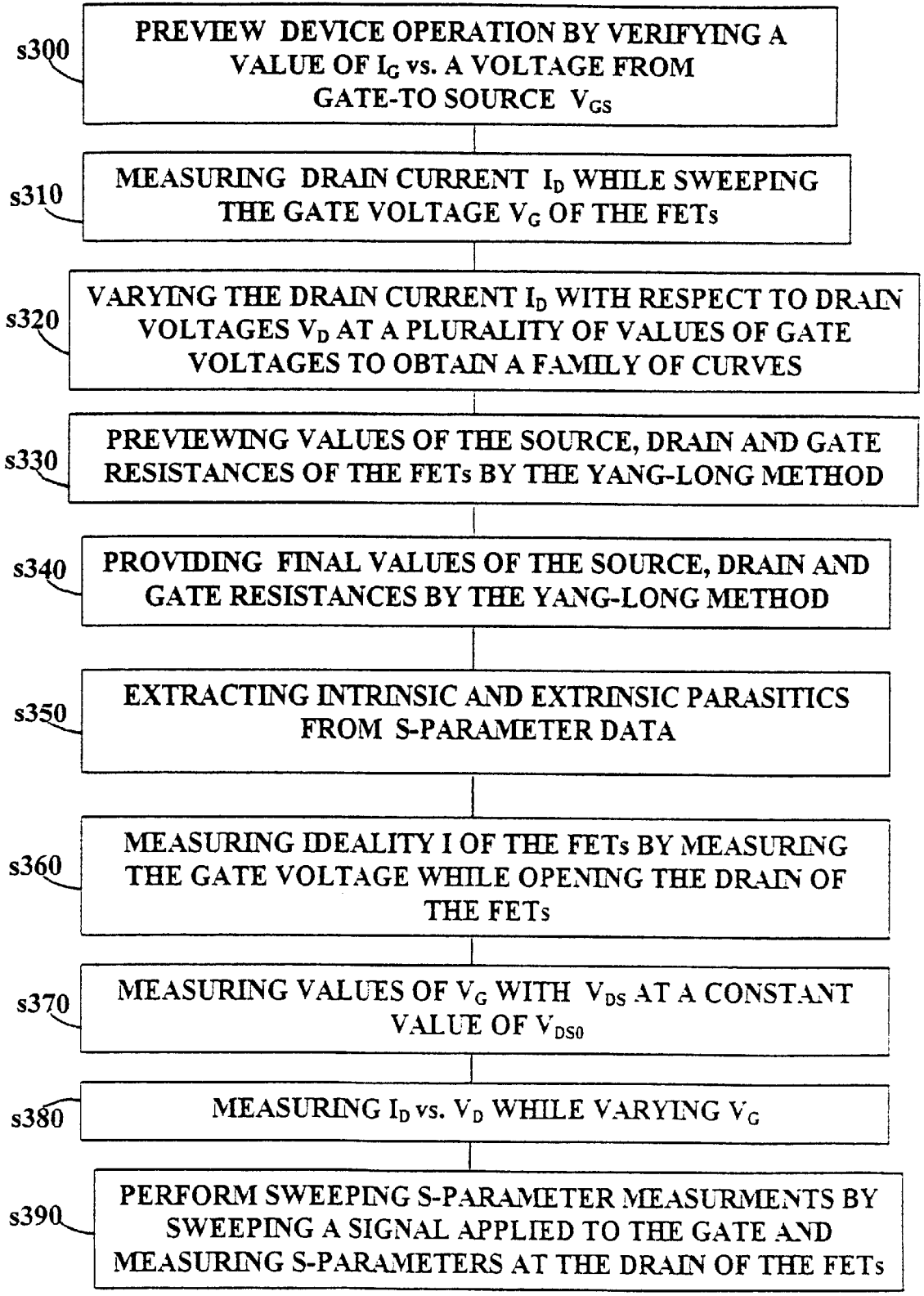

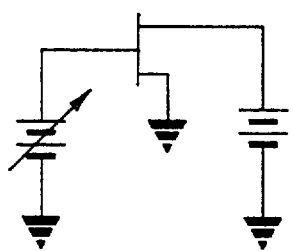
FIG. 6a
FIG. 6b
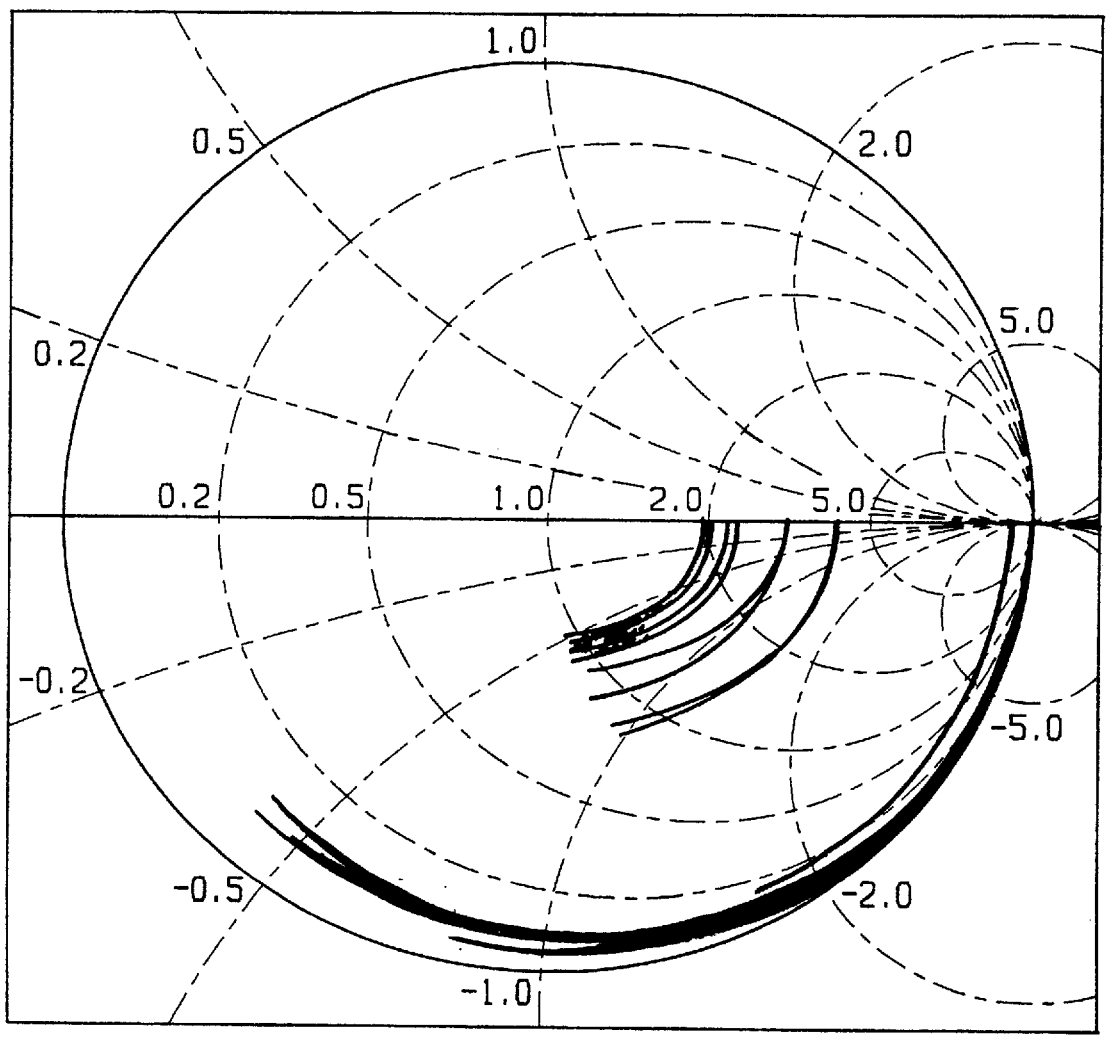

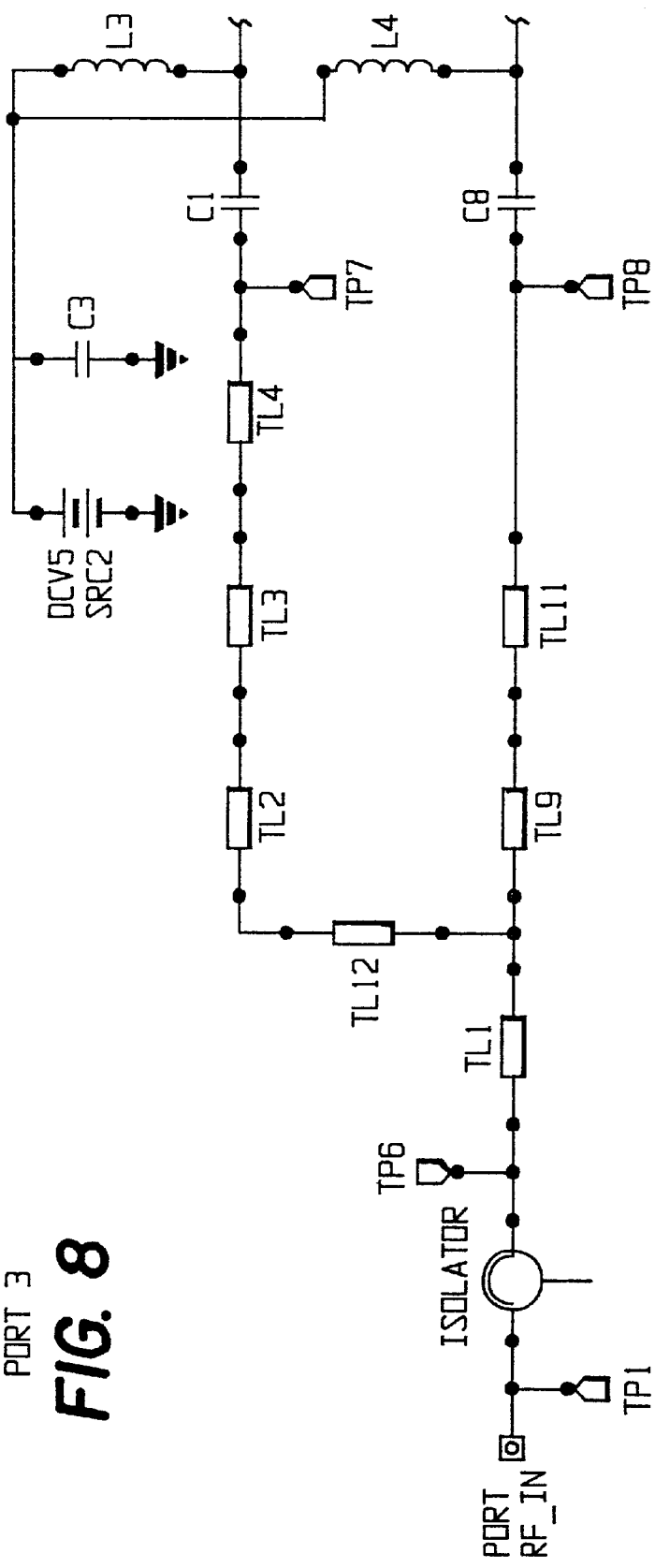
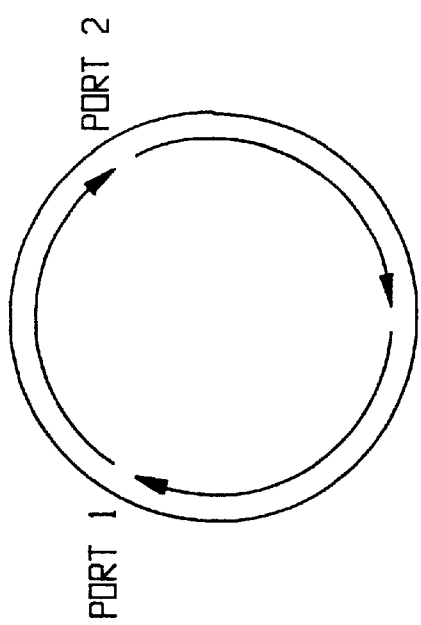
FIG. 8
FIG. 9a

PROCESS FOR A HIGH EFFICIENCY CLASS D MICROWAVE POWER AMPLIFIER OPERATING IN THE S-BAND

ORIGIN OF THE INVENTION

This invention was made by an employee of the United States Government and may be manufactured and used by the U.S. Government for Governmental purposes without the payment of royalties.

BACKGROUND OF THE INVENTION

1. Field of the Invention

The present invention relates to high efficiency microwave power amplifiers (HEMPA) used in communication devices. More particularly, the present invention relates to high efficiency microwave power amplifiers operating in the S-Band region, which provide communication for spacecrafts and satellites using systems such as the Tracking and Data Relay Satellite System (TDRSS) implemented by NASA.

2. Description of the Related Art

In communication systems, there is a strong need for power amplifiers with high efficiency to maximize the amount of talk time obtained from a power source. This need is especially important for communications involving spacecraft, where available power is very limited, and the amounts and types of payloads which are provided for scientific experiments are adversely affected by lower communication efficiencies.

The space shuttle orbiter communication system is used for transferring telemetry information regarding orbiter operating conditions and configurations, systems and payloads either directly with the ground, or through TDRSS. The commands sent to the orbiter system allow for functional or configurational changes.

In addition, documentation sent from ground control, which is printed on the orbiter's teleprinter or text and graphics system, as well as voice communications among the flight crew members and/or between ground control, are within the control of this system.

In addition, certain communications in the TRDSS system are within the S-Band of the RF spectrum (microwaves ranging approximately from 1,700 to 2,300 MHz). In particular, S-band FM and S-Band PM systems can be used to transfer information between the space shuttle orbiter communication system and the ground on RF signals in the S-Band frequency range.

There are several known classes (e.g. A, B and C) of amplifiers, each class having various operational characteristics specific to the respective class.

For example, Class-D amplifiers (shown in FIG. 1), which have two transistors (Q1 and Q2) in a push-pull configuration, are suited for applications requiring reduced power. One advantage of using Class-D amplifiers is that the transistors function as switches instead of current sources, which is particularly advantageous for generating square waves.

In addition, Class-D amplifiers allow for high voltages to operate across a device and for large current to operate through the device, but not at the same time. This arrangement saves power, and is a primary reason why Class-D amplifier have very good efficiency.

Class-D amplifiers have been used extensively for frequencies ranging from the Low-Frequency (LF) to High Frequency (HF), with an efficiency of approximately 85–90 percent in the HF range.

At the lower frequency bands, Class-D amplifiers are assumed to have: (1) transistors operating with zero on-resistance; (2) infinite off-resistance; zero saturation voltage; (3) instantaneous switching and perfect timing; and (4) negligible capacitance and inductance.

However, at the microwave range of the RF spectrum, particularly in the S-band, the above assumptions regarding Class-D amplifiers are invalid. The operating efficiency of a Class-D Amplifier in the microwave range is well below the 85–90 percentage achieved at the HF range.

The efficiency losses of the Class-D Amplifier, particularly in the microwave range, result from switching, conduction and gate drive losses. As the operating frequency increases, so does the associated losses.

Accordingly, the Low Frequency and High Frequency assumptions regarding power generation for Class-D Amplifiers are not applicable in the S-Band region. There remains a need for new design techniques for a Class-D Amplifier which operates in the S-Band region with high efficiency.

SUMMARY OF THE INVENTION

Accordingly, it is an object of the present invention to develop a high efficiency microwave power amplifier.

To this end, according to the present invention, there is provided a process for providing a High Efficiency Microwave Power Amplifier (HEMPA) which propagates a microwave frequency square wave, wherein said method utilizes a circuit simulation program for simulating Field Effect Transistors (FETs) at high DC-to-RF efficiencies, and comprises the steps of:

(a) analyzing linear elements of a plurality of selected FETs in a frequency domain;

(b) analyzing non-linear elements of the plurality of selected FETs in a time domain;

(c) converting the time domain values obtained in step (b) into the frequency domain by using a Discrete Fourier Transform (DFT) of the time domain values;

(d) performing a series of DC and S-parameter simulated measurements based on predefined data specific to each one of the selected FETs contained in the simulation program and from values obtained in steps (a) to (c);

(e) extracting and isolating individual device parameters of the selected FETs by converting the S-parameters to one of admittance and impedance parameters to derive FET models for each of the selected FETs;

(f) employing the FET models derived in step (e) in a simulated amplification circuit of the simulation program to provide a final output of a HEMPA circuit based on iterative simulations of the amplification circuit utilizing microwave topology at microwave frequencies, wherein the iterative simulations of the amplification circuit include analyzing output values of a plurality of cascaded stages of the selected FETs, and said cascaded stages including at least an input stage and an output stage of FETs, with each stage having FETs arranged in a push-pull configuration;

(g) receiving the final output of the HEMPA circuit from the simulation program after the iterative simulations provided in step (f) are a sufficient quantity to provide values of components for connection with the cascaded stages of FETs to provide said HEMPA circuit.

In an embodiment, the FET models employed in step (f) include a driver stage cascaded between said input stage and said output stage.

In an embodiment, the iterative simulations may be provided for microwave frequencies in the S-band region. In another aspect of the invention, the push-pull configuration of FETs employed in step (f) in each of the cascaded stages are Class D amplifiers.

In another aspect of the invention, the extracting and isolating of the FETs to derive the models provided in step (e) may comprise:

(1) previewing device operation by verifying a value of gate current ($I_g$) vs. a voltage from gate-to-source ($V_{gs}$);

(2) measuring a drain current ($I_d$) while sweeping a gate voltage the FETs;

(3) varying the drain current ($I_d$) with respect to drain voltages ($V_d$) at a plurality of values of gate voltage to obtain a Family of Curves;

(4) previewing source, drain, and gate resistances of the FETs by using the Yang-Long method;

(5) providing a final measurement of the resistances previewed in step (4) by the Yang-Long method;

(6) extracting intrinsic and extrinsic parasitics from S-parameter data;

(7) measuring ideality (I) of the FETs by measuring the gate voltage of the FETs while opening the drain of said FETs;

(8) measuring values of $V_g$ with $V_d$ s at a constant value of $V_{ds0}$;

(9) measuring $I_d$ vs. $V_d$ while varying $V_g$; and

(10) performing sweeping S-parameter measurements by sweeping a signal applied to the gate and measuring the S-parameters at the drain of the FETs.

In an embodiment, the present process may include employing FET models recited in step (f) includes for each respective stage:

(1) using ideal component values in regards to frequency response and power loss during initial iterative simulations in the simulation program; and (2) replacing the ideal component values recited in step (f)(1) with realistic values based on manufacturer's specification of each respective component during latter iterative simulations so as to provide a more realistic response of said HEMPA circuit.

In addition, a high efficiency microwave power amplifier product according to the above processes are clearly within the scope of the invention.

BRIEF DESCRIPTION OF THE DRAWINGS

FIG. 3 is a flowchart illustrating sub-steps from the process illustrated in FIG. 2.

FIG. 5b shows the results of the measurement made by the configuration shown in FIG. 5a.

FIG. 6a shows the configuration for a DUT to measure the S-parameters.

FIG. 6b shows a first set the S-parameter measurements for the DUT shown in FIG. 6a.

FIG. 8 shows an example of a microwave circulator.

FIGS. 9a and 9b show respective halves of an example of a first stage analysis of the amplifier.

DETAILED DESCRIPTION OF THE PREFERRED EMBODIMENTS

In order to design a Class-D High Efficiency Microwave Amplifier for operation in the S-band region, it is necessary to utilize a circuit simulation program, which simulates, in particular, Gallium Arsenide (GaAs) Field Effect Transistors (FET's) at high DC-to-RF conversion efficiencies.

For example, the Hewlet Packard HP 85190A IC-CAP Software is an example of an appropriate circuit simulation program. The HP Eefet3 model is an empirical model developed for fitting measured electrical behavior of GaAs FET's. The HP EEfet3 model includes the following features:

An accurate isothermal drain-source current model that fits virtually all processes.

Self-heating correction for the drain-source current.

A charge model that accurately emulates capacitance values.

A dispersion model that permits simultaneous fitting of high-frequency conductance and DC characteristics.

A breakdown model that describes gate-drain current as a function of both Vgs and Vds.

The capability to extrapolate outside the measurement range used to extract the model.

In particular, a jomega Nonlinear HP EEFet3 Model includes a kernel routine for a GaAs FET nonlinear model. This kernel routine is a direct synthesis of the HP EEFet3 GaAs FET model, and consists of time and frequency domain models.

Figure 2:
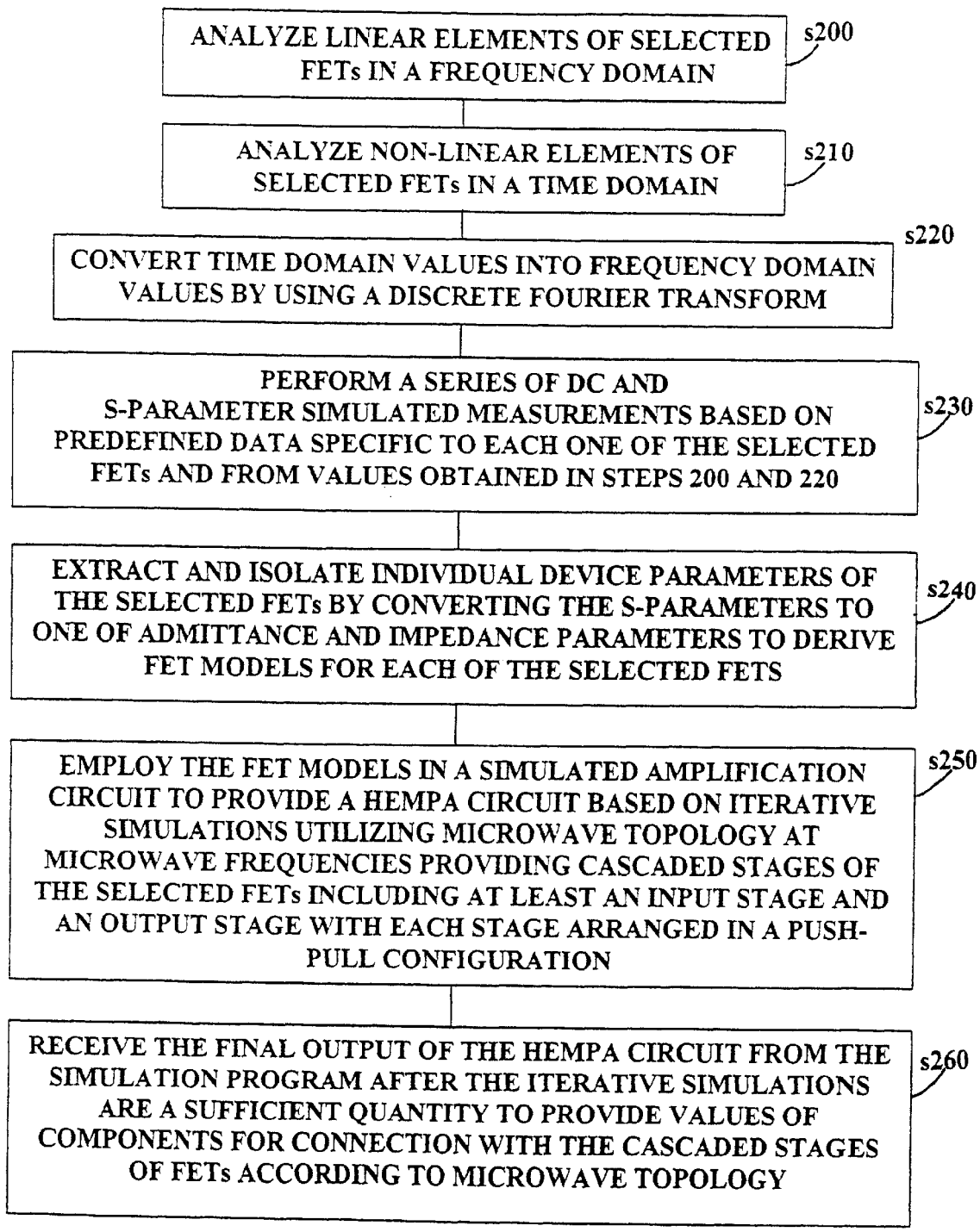
FIG. 2 is a flowchart illustrating a process according to an embodiment of the invention.

FIG. 2 is a flowchart illustrating an embodiment of the process for providing a High Efficiency Microwave Power Amplifier of the present invention.

At step 200, the linear elements of the selected FETs are analyzed in the frequency domain by standard simulation techniques.

At step 210, the nonlinear FET elements are analyzed in the time domain, so that the physical characteristics of the elements are preserved.

At step 220, the conversion from the time domain to the frequency domains is accomplished by using a discrete Fourier transform (DFT).

At step 230, the high-frequency FET modeling software performs a series of DC and S-Parameter (Scattering Parameter) measurements of the selected FETs, based on predefined measurement configurations and on variables defined during the procedures of steps 200 to 220.

At step 240, the individual device parameters of the selected FETs are extracted and isolated through software conversion of the S-parameters to admittance or impedance parameters. FET models for each of the selected FETs are derived as a result.

At step 250, the resulting FET models may then be used to simulate the performance of the actual device in a circuit under design. A HEMPA circuit is provided based on a series of iterative simulations using microwave topology at microwave frequencies to provide an output of a HEMPA circuit comprising cascaded stages of the selected FETs including at least an input stage and output stage, with each stage arranged in a push-pull configuration.

At step 260, a final output of the HEMPA circuit is received from the simulation program after the iterative simulations are of a sufficient quantity to provide realistic values of components for connection with the cascaded stages according to microwave topology.

FIG. 3 describes in detail the sub-steps (procedures) of step 240 that are used in this particular embodiment. The procedures involved use a series of setups to measure current or voltage vs. bias under different bias conditions. The purpose of the different measurement setups is to decouple the model equations, as much as possible, and to isolate effectively the individual FET parameters. The following ten sub-steps are used to isolate the FET parameters:

At step 300, a device preview is performed by verifying a value of the gate current $I_g$ vs. a voltage from gate-to-source $V_{gs}$;

At step 310, the drain current $I_d$ is measured while sweeping the gate voltage $V_g$;

At step 320, the drain current $I_d$ is varied and measured with respect to drain voltages at several values of gate voltage (to obtain the Family of Curves);

Thus, the first three measurements (steps 300–320) involve the aforementioned device preview, used to verify proper device operation, and whether the device is operating within maximum voltage and current values. This includes measuring $I_g$ vs. $V_g$s, $I_d$ vs. $V_{gs}$ at $V_{ds0}$, and the $I_d$ and $V_{ds}$, vs. $V_{gs}$, with the latter measurement being more commonly known as the "family of curves." These measurements are used to obtain a set of measured DC I–V curves for the particular device for use in other measurement configurations.

In the first measurement, the gate and drain voltages are monitored as the gate current is swept across the proper operating range.

Figure 1:
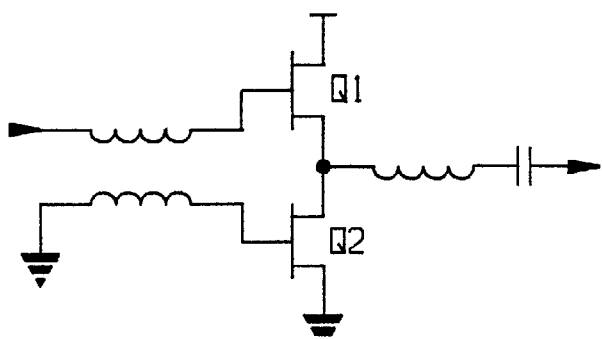
FIG. 1 is a circuit diagram showing an example of a typical Class D amplifier.
Figure 4A:
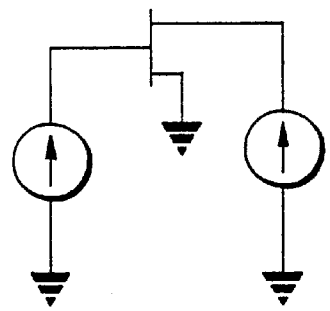
FIG. 4a shows the biasing arrangement for the Device-Under-Test (DUT) in step 300.

FIG. 4a shows the bias arrangement for the Device-Under-Test (DUT) used in step 300. The purpose of this setup is to use the gate current density of the device, and the gate width and length, to set the proper values for gate voltage.

In the second measurement, the drain current is measured as a function of swept gate voltage, and is done at a single drain voltage bias point, or Ids vs. Vgs at Vds0. The values of the gate voltage are selected to take the device from the pinch-off to IDSS, the drain saturation current.

Figure 4B:
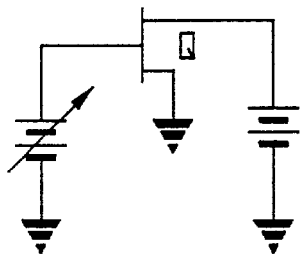
FIG. 4b shows the biasing arrangement for the DUT configuration in step 310.

FIG. 4b shows the DUT configuration for the second measurement. Drain current (Id) is measured as a function of swept gate voltage, with drain voltage set to a constant bias value, equal to $V_{ds0}$.

The second measurement covers all regions of device operation from sub-threshold through the threshold and high current regions. Vds0 is an important operating characteristic for most GaAs FETs. The models I–V equations greatly simplify at $V_{ds0}$. Setting $V_{ds0}$ appropriately helps to ensure that the rest of the I–V and dispersion parameters will extract correctly.

Figure 4C:
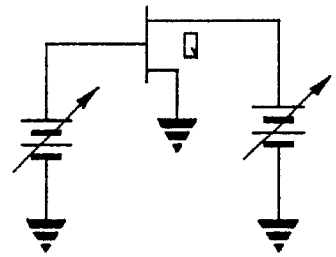
FIG. 4c shows the biasing arrangement for the DUT configuration in step 320.

FIG. 4c shows the DUT configuration to obtain the family of curves by the third measurement.

The third required measurement is of the drain current with respect to drain voltage occurs at several values of gate voltage. This third measurement, known as the family of curves, covers the overall region of the operation of the device. At step 330, the source, drain and gate resistances are previewed using the Yang-Long method; this method is known by persons of ordinary skill in the art, and the contents of *New Method to Measure the Source and Drain Resistance of the GaAs MESFET,* by Yang, Long and Long, Stephen, IEEE Electron Device Letters, Vol. EDL-7, No. 2, February 1986, is incorporated by reference as background material.

The measurement of the source, drain and gate resistances can also be made by using one of several known evaluation techniques to accurately determine these values, with the most common of which being the end-resistance measurement.

The end-resistance measurement is accomplished by using the unbiased drain as a voltage probe to measure the voltage at the top end of Rsource ($R_s$) while a substantial current us forced into the gate. However, this method has inaccuracies due to channel resistance effects.

Accordingly, the Yang-Long Modified End Resistance Measurement Technique, which overcomes the inaccuracy of the measurement of $R_s$ due to channel resistance effects, is used in the IC-CAP software package.

The Yang-Long method computes the values of Rs from the change in Vgs due to the application of two drain currents, which are 50 to 100 times greater than Ig.

The data for the computation of Rs is taken by sweeping Ig over a range that results in measured Vgs values in the range of 0.300 VDC to 0.600 VDC. Two separate Ig sweeps are made, with current forced at the drain terminal at two levels. The smaller of the two Id currents is chosen to be within 10 percent of the larger current.

Derivations for the shift in Vgs depend on items in addition to the gate diode's active resistance and Rs. The form of these expressions cannot be reduced to Rs=xx, so the measured and computed Vgs values are optimized until a suitable Rs is found.

In order for the Yang-Long method to work, the gate diode characteristics Is and N, saturation current and ideality, respectively, must first be known. Three measurements are required for this technique: (1) the Yang-Long preview, gate diode, and Yang-Long measurement.

Figure 4D:
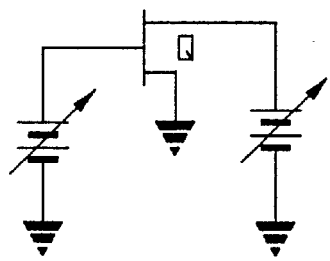
FIG. 4d shows the Yang-Long preview configuration for the DUT configuration in step 330.

FIG. 4d shows the Yang-Long preview configuration for a DUT. This configuration is used to measure both Ig and Id as a function of Vg, and the results are displayed on a logarithmic scale. The setup is used to ensure that the current input values chosen fall within the limits prescribed by Yang and Long.

The dynamic resistance attributed to the gate diode formed by the Schottky contact is important to the extraction of all contact resistances. This procedure measures swept gate current as a function of gate voltage, with Vdsconstant at zero, and displays the results on a logarithmic scale. These data are used for characterization of the gate diode forward conduction parameters Is and N.

Figure 4E:
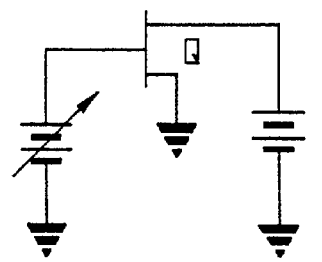
FIG. 4e shows the configuration for the final Yang-Long measurement at step 340.

FIG. 4e shows the configuration for the final Yang-Long measurement made at step 340. after verification of the preview measurements. This configuration for the measurement procedure uses the Ids and Igs derived from the results of the Yang-Long preview measurement. This setup drives two different and relatively small amounts of drain current into the device. The DC Source Monitor sweeps Igs values that are 50 to 100 times smaller than Ids to give Vgs values that differ slightly. This difference in $V_{gs}$ is due to the common lead resistance. The purpose of this measurement is to extract EEFet3.rs component of the device, where EEFet3.rs is the source resistance of the device.

Figure 4F:
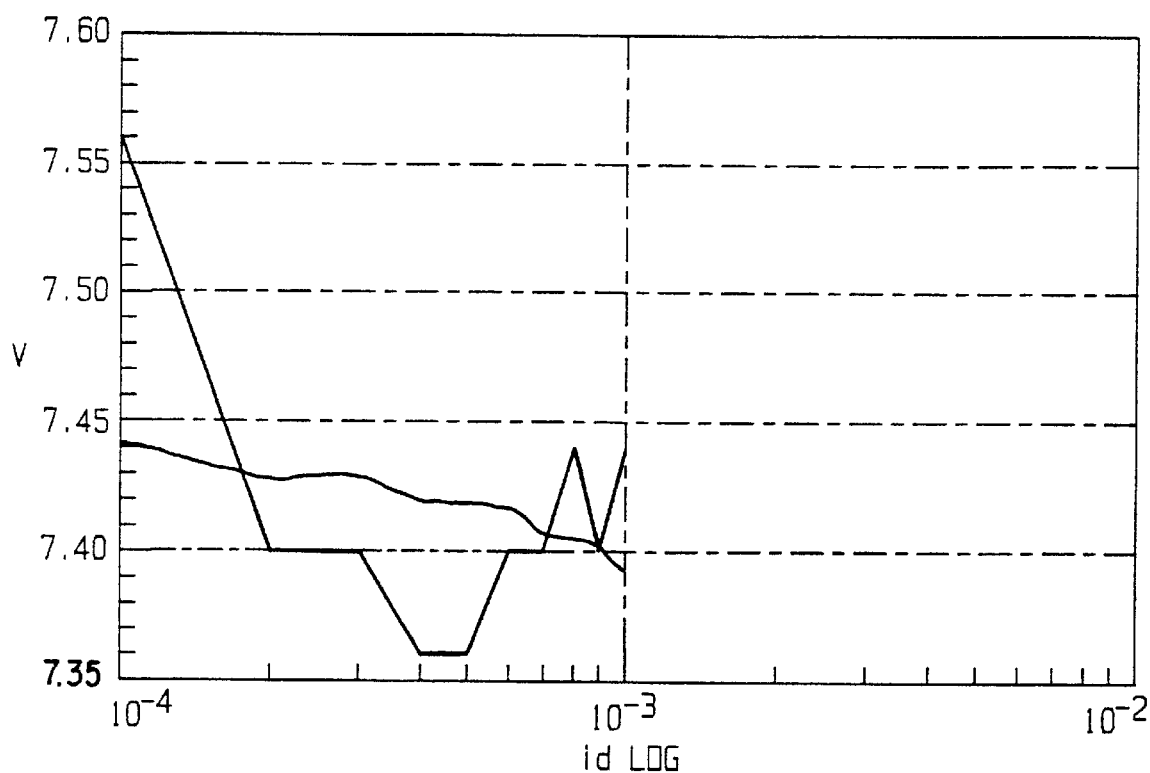
FIG. 4f is a graph which plots the results of the source resistance measurements using the Yang-Long Method.

FIG. 4f is a graph plotting the results of the final values source of resistance measurements using the Yang-Long Method from step 340.

At step 350, the extrinsic and intrinsic parasitics are extracted from the S-parameter data.

According to step 350, there is an extraction for intrinsic and extrinsic parasitics from S-parameter data measured with a calibrated network analyzer.

Figure 5A:
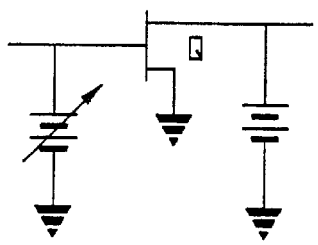
FIG. 5a shows the configuration for the Rg vs. Rd measurement.

FIG. 5a shows the configuration used for the Rg vs. Rd measurement. The Rg and Rd contact resistances are extracted from cold FET measurements made with the device strongly forward biased in both the gate-drain and gate-source regions.

The package resistance and inductance parasitics are extracted from S-parameter data measured across Vgs with Vdsat the nominal operating point. It is particularly important to make sure that the nominal operating conditions are used for extraction of contact resistance and parasitic parameters. Otherwise, errors can be caused by bias dependencies which are not represented in the model.

Successful extraction of certain extrinsic parasitic elements is dependent upon forcing the active device under test to a bias condition where its linear equivalent circuit reduces to a very simple form. While the HP 85192B EEFet3 GaAs FET model uses the "cold FET" method ($V_{ds}$=0.00 VDC, $V_{gs}$=0.0 VDC) to optimize the contact resistances and parasitic inductances of the bond wires, further amplification can be achieved by strongly forward biasing the gate-source and gate-drain regions of the FET.

By strongly biasing the forward gate bias, the intrinsic charge model of the FET is shunted by small resistances of the forward active diode in the gate and the fully open channel between the drain and the source. Under the aforementioned circumstances, the reactive behavior of the device is attributable to the lead inductances of the device. Both the drain and gate resistances are separable if the value of Rs is known.

For example, the FET is forward-biased at three to five points. The extrinsic elements are constant, while the gate and channel characteristics change. The purpose of this measurement is to extract the EEFet3.rd, EEFet3.rg, and preliminary values of ls.l, lg.l, and ld.l components of the device, where EEFet3.rd and EEFet3.fg are the drain and gate resistances, and ls.l, lg.l and ld.l are the source, gate, and drain package inductances. The RF parameter extraction and large-signal model generation require the reduction of a large number of S-parameter sets into an equivalent circuit format.

Although numerical optimization techniques often have been used for extracting these small-signal models, their uniqueness and long execution times make them impractical here. Fast techniques for extracting complete small-signal models have been described previously but all require the additional RF characterization of the cold FET in order to extract parasitic inductance. This additional characterization offers preliminary inductance values, but the values are not completely accurate because the model has not been derived solely from the data it is asked to model.

The method adopted here for approximating the package parasitics requires RF characterization at the device operating point and knowledge of the parasitic resistances. After determining the parasitic resistances from DC measurements, the remaining elements are computed directly from a single set of measured S-parameters.

Figure 5B:
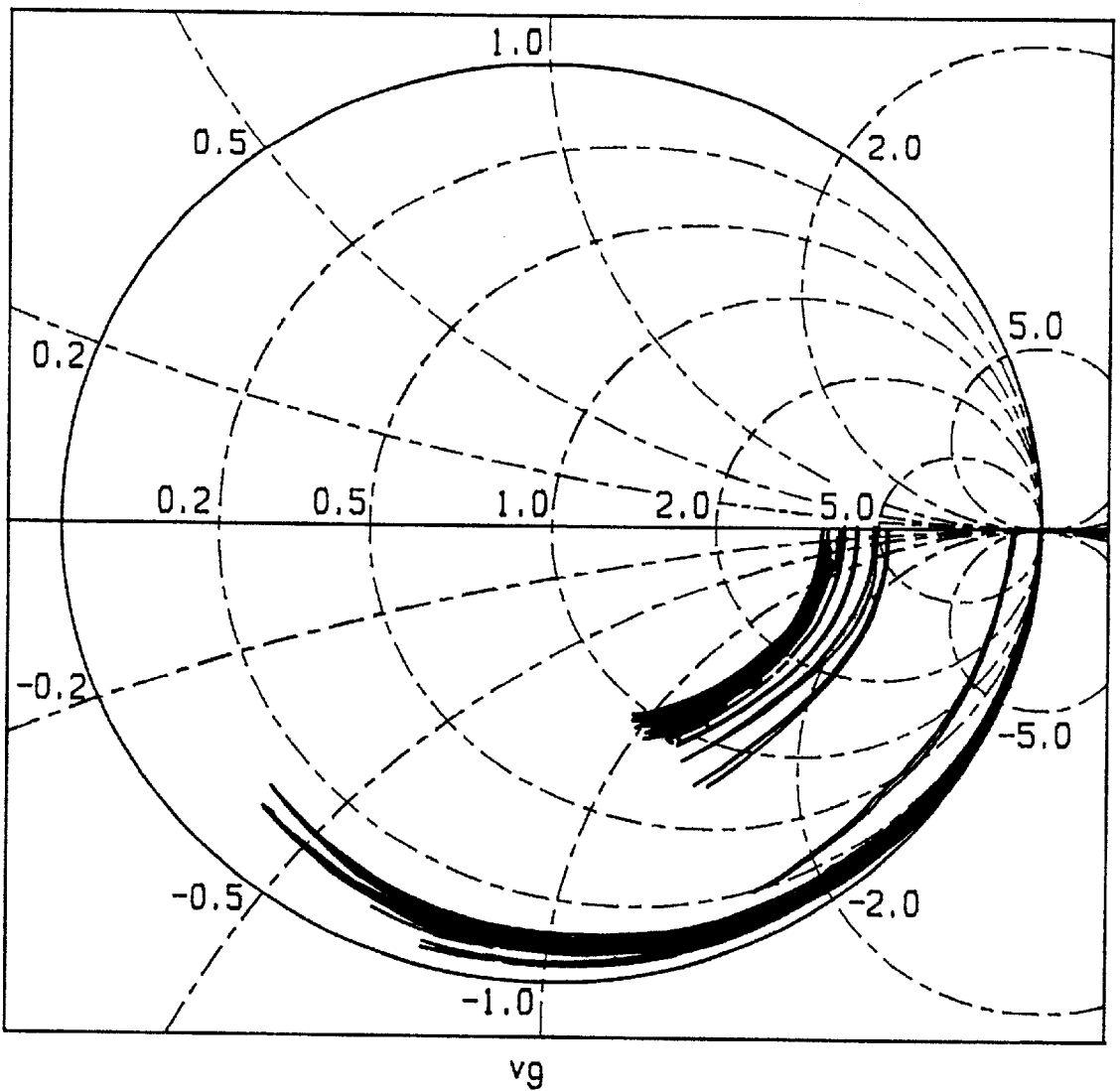

Thus, the adopted method is very fast, and the results provide an excellent match to measure S-parameters throughout the saturation region. The purpose of this measurement is to finalize the preliminary values obtained in the cold-FET measurements of ls.l, lg.l, and ld.l components of the device. To measure the package parasitics, the device under test is configured as shown in FIG. 5a, and the results are shown in FIG. 5b.

Figure 5C:
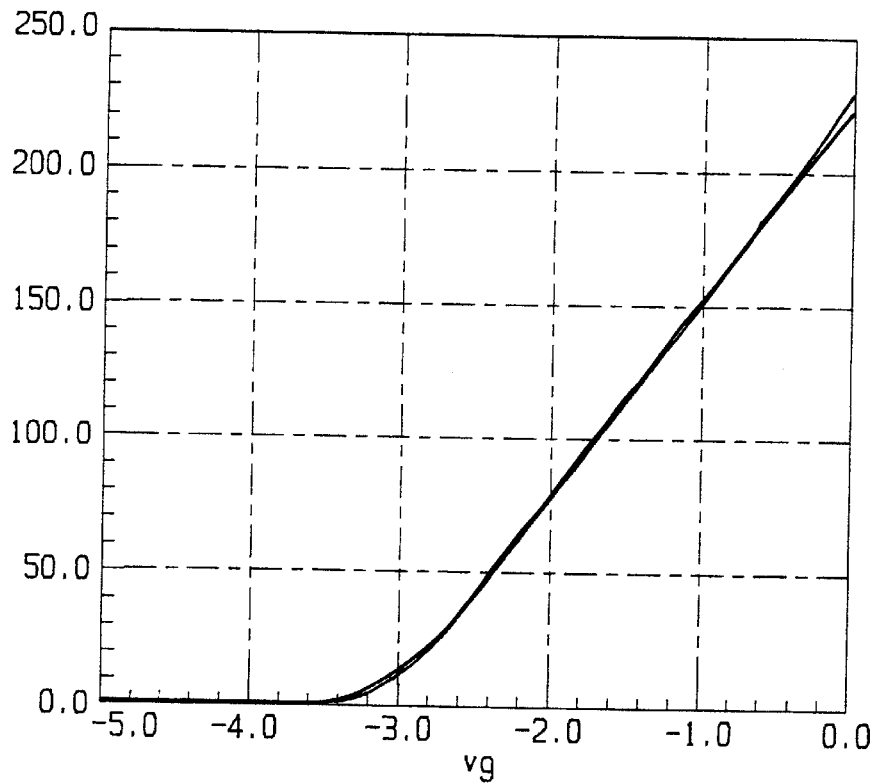
FIG. 5c is a graph of the measurement results from step 370.

At step 360, the Ideality, I, of the FET is measured. This ideality is a number that represents how well the FET mimics an ideal diode. This number should range from 1.0 (an ideal diode) to about 1.5 to be acceptable, and the value is unitless. The ideality setup forces the FET into a forward-biased diode configuration, by applying a swept voltage at the gate and opening the drain. Gate-source current is measured as the gate voltage is swept. The device under test configuration remains as shown in FIG. 5c.

The data from this DC measurement are used to extract the diode parameters VBI (built in voltage), Is (junction saturation current), and N (ideality factor). Caution must be used in this measurement as the gate-source junction is forward biased.

At step 370, the values of Vg are measured with Vds at a constant value of Vds0. The eighth step is the refinement of Ids-Vgs at Vds0, which was made in the preview section and measures all the values of Vg with Vds at a constant value of Vds0.

The configuration for the measurement of Vg in step 370 is as shown in FIG. 5*a*. The purpose of this measurement is to extract the EEFet3.vt0, EEFet3.gmmax, EEFet3.vg0 and EEFet3.vdelt, where EEFet3.vt0 is the zero bias threshold parameter, EEFet3.gmmax is the peak transconductance parameter; EEFet3.vg0 gate-source voltage where transconductance is a maximum; and EEFet3.vdelt is the parameter that controls the linearization point for transconductance characteristics, and the measurement results are shown) in FIG. 5*c*.

At step 380, the values of Id vs. Vd are measured while varying Vg. This step involves measuring the drain current (Id) with respect to drain voltage (Vg), at several values of gate voltage. The drain voltage is swept from 0 VDC to the upper limit of the device under test's operating range.

Figure 5D:
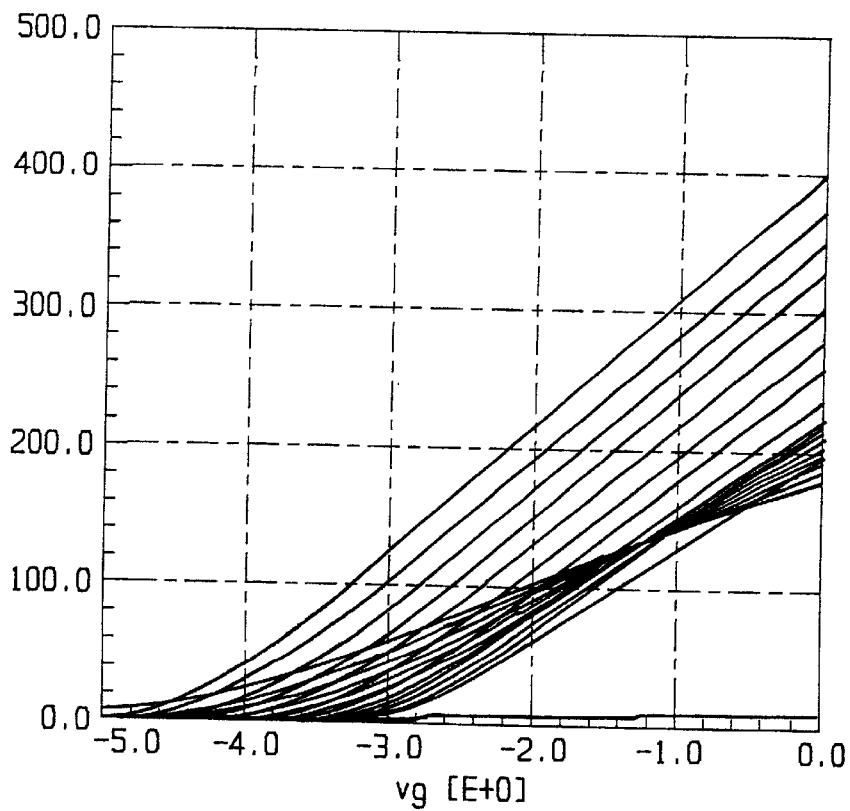
FIG. 5d is another graph of the measurement results from step 370.

The proper configuration to measure the Id vs. Vgs is also as shown in FIG. 5*a*, and FIG. 5*d* shows the results of these measurements.

At step 390, sweeping S-parameter measurements are performed by sweeping a signal applied to the gate and measuring S-Parameters at the drain of the FETs. The tenth step involves sweep S-parameters measurements in the following two setups which allows for extraction of parameters related specifically to the high-frequency performance of the device. A swept-frequency signal is applied to the gate and the device S-parameters are measured at the drain.

The first setup is an AC analysis involving measurements of the S-parameters across a calibrated microwave frequency range, to extract the AC charge and dispersion parameters. This measurement is performed with Vdsset to a constant bias value of Vds0.

The second setup has Vds actively biased across the device operating range.

FIG. 6 shows the typical configuration to measure the S-parameters. This procedure measures the S-parameters at Values of Vgs from pinch-off to Vgsmax with Vds at Vds0, the point where the model equations simplify. The large range of Vgs values allows the largest intrinsic model variations possible, increasing the impact of the charge parameters and making them easier to extract.

The purpose of this measurement is to extract EEFet3.c110, EEFet3.c11th, EEFet3.vinfl, EEFet3.deltgs, EEFet3.gmmaxac, EEFet3.vdeltac, EEFet3.kappac, EEFet3.vtoac, and EEFet3.kdb, wherein Fet3.c110 is the maximum input capacitance for VDS=Vds0 and Vds0>DELTAds; EEFet3.c11th is the minimum (threshold) input capacitance for Vds=Vds0; Eefet3.vinfl is the inflection point in C11 Vgs characteristic; EEFet3.deltags is the C11th to C110 transition voltage; EEFet.3gmmaxac is the peak AC transconductance parameter; EEFet3.vdeltac is the parameter that controls the linearization point for transconductance characteristics; EEFet3.kappac is the output conductance parameter; EEFet3.vtoac is the zero bias threshold parameter; and EEFet3.kdb is the parameter that controls Vds dependence of additional d-b branch conductance.

Figure 6C:
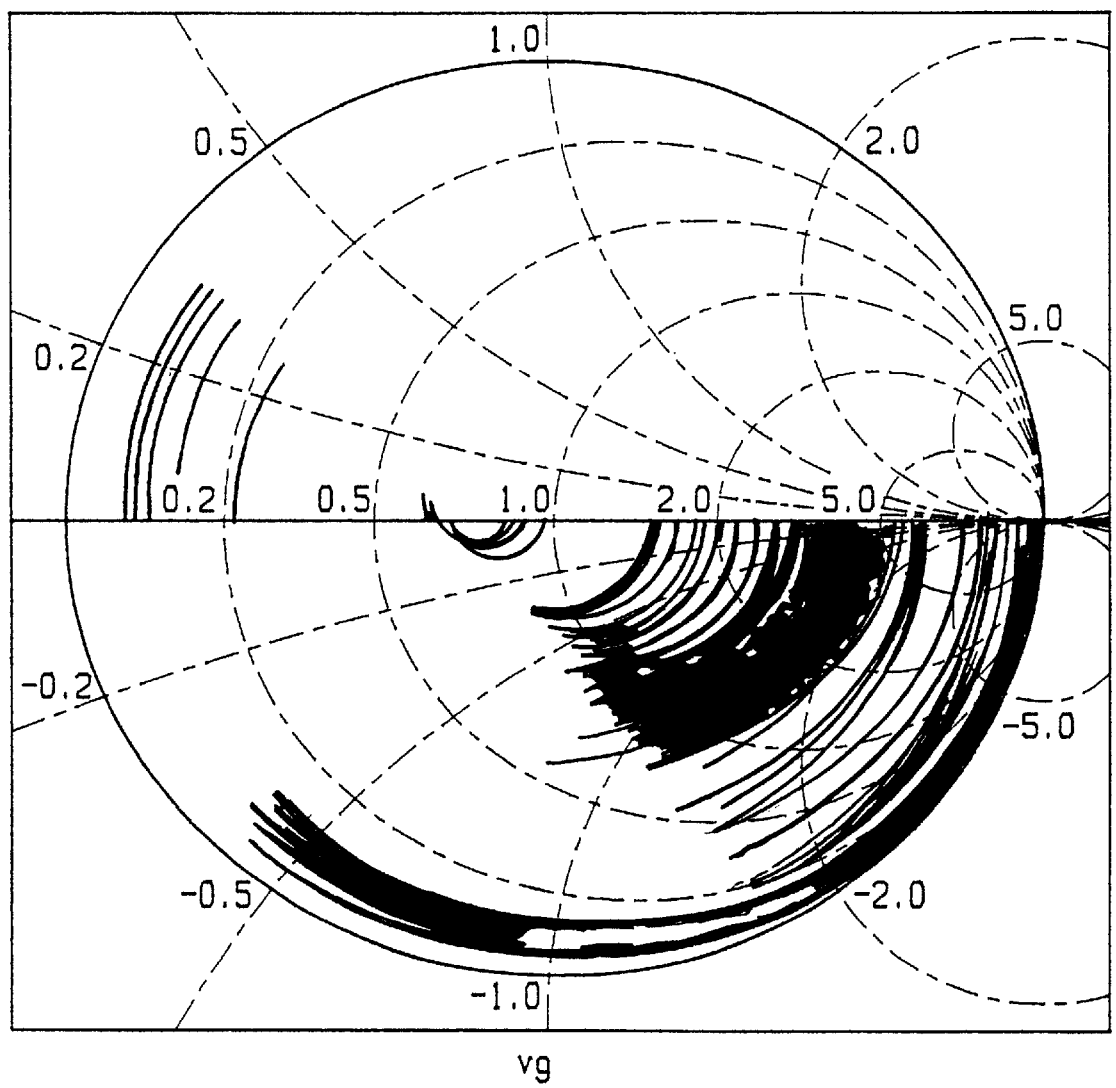
FIG. 6c shows a second set of S-parameter measurements while varying the value of Vgs from pinch-off to Vgs max and sweeping Vds across the operating range.

The results of the S-parameter measurements are shown in, for example, FIG. 6*b*. After the first S-parameter measurements, a second set is taken. In this set of measurements, the value of Vgs varies from pinch-off to Vgsmax and Vds is swept across the device operating range. The results are shown in FIGS. 6*c*.

Once the measurements have been performed and a complete set of data collected for a particular device, the extraction can proceed. The extraction process iteratively determines the proper small-signal model parameter values. In all the equations governing the behavior of the model, the voltages are assumed intrinsic. There is no known way to measure or set the intrinsic voltages, so they must be determined indirectly. To accomplish this indirect determination, the parasitic resistances and inductances must first be accurately known. The intrinsic voltages can be calculated from these parasitic values and the known currents.

These intrinsic voltages are used by the HP EEFet3 model to predict device performance, so they must be known before any other parameters can be extracted.

Tables I, II, and III, shown below, list the final extracted values of each parameter for the HP EEFet3 model.

TABLE I

Final Extracted values for the NEC-9001-75 HP EEFet3 Model

| VARIABLE | VALUE | VARIABLE | VALUE | VARIABLE | VALUE |
|---|---|---|---|---|---|
| 1g.1 | 193.3p | EEFET3.gmmax | 63.60 m | EEFET3.rdb | 1.000G |
| 1d.1 | 55.90p | EEFET3.gamma | 22.85 m | EEFET3.obs | 160.0f |
| 1s.1 | 55.23p | EEFET3.kapa | 33.33 m | EEFET3.gdbm | 109.9u |
| cxgd.c | 0.000 | EEFET3.peff | 3.858 | EEFET3.kdb | 100.0 |
| cxds.c | 0.000 | EEFET3.vto | −3.832 | EEFET.vdsm | 100.0 |
| cxgs.c | 0.000 | EEFET3.vtso | −100.0 | EFFET3.c110 | 1.047p |
| gate.mode | 0.000 | EEFET3.vdelt | 226.7 m | EFFET3.c11th | 281.0f |
| drain.mode | 0.000 | EEFET3.vch | 1.000 | EEFET3.vinfl | −3.273 |
| source.mode | 0.000 | EEFET3.vsat | 1.452 | EEFET3.deltgs | 6.446 |
| g.z. | 100.0 | EEFET3.vgo | −2.262 | EEFET3.deltds | 100.0m |
| g.l | 4.609m | EEFET3.vdso | 3.00 | EEFET3.lambda | 15.36m |
| g.v | 1.000 | EEFET3.vco | 10.00 | EEFET3.cl2sat | 118.9f |
| d.z | 100.0 | EEFET3.mu | 0.000 | EEFET3.cgdsat | 105.1f |
| d.l | 1.013m | EEFET3.vba | 1.00 | EEFET3.kbk | 30.00m |
| d.v | 1.000 | EEFET3.vbc | 1.000 | EEFET3.vbr | 25.00 |
| s.z | 50.00 | EEFET3.deltgm | 0.000 | EEFET3.nbr | 2.000 |
| s.l | 0.000 | EEFET3.deltgmac | 0.000 | EEFET3.idsoc | 1.893 |
| s.v | 1.00 | EEFET3.alpha | 1.000m | EEFET3.ris | 2.945 |
| fet.ugw | 1.000 | EEFET3.gmmaxac | 56.02 | EEFET3.rid | 1.000m |
| fet.n | 1.000 | EEFET3.gammaac | 16.81 | EEFET3.tau | 3.072 |
| EEFET3.rg | 2.685 | EEFET3.kapaac | 66.67m | EEFET3.cdso | 246.5f |
| EEFET3.rd | 793.9m | EEFET3.peffac | 8.708 | EEFET3,ugw | 1.000 |
| EEFET3.rs | 895.7m | EEFET3.vtoac | −3.745 | EEFET3.ngf | 1.000 |

TABLE I-continued

Final Extracted values for the NEC-9001-75 HP EEFet3 Model

| VARIABLE | VALUE | VARIABLE | VALUE | VARIABLE | VALUE |
|---|---|---|---|---|---|
| EEFET3.Is | 2.733p | EEFET3.vtsoac | −100.0 | EEFET3.kmod | 103.0 |
| EEFET3.n | 1.125 | EEFET3.vdeltac | 113.3m | EEFET3.kver | 1.000K |

TABLE II

Final Extracted values for the NEC-9002-75 HP EEFet3 Model

| VARIABLE | VALUE | VARIABLE | VALUE | VARIABLE | VALUE |
|---|---|---|---|---|---|
| 1g.1 | 398.2p | EEFET3.gmmax | 29.45m | EEFET3.rdb | 1.000G |
| 1d.1 | 903.1p | EEFET3.gamma | 28.38m | EEFET3.obs | 160.0f |
| 1s.1 | 55.23p | EEFET3.kapa | 33.33m | EEFET3.gdbm | 200.0u |
| cxgd.c | 1.000 | EEFET3.peff | 2.234 | EEFET3.kdb | 100.0 |
| cxds.c | 0.000 | EEFET3.vto | −3.333 | EEFET.vdsm | 100.0 |
| cxgs.c | 0.000 | EEFET3.vtso | −100.0 | EFFET3.c110 | 460.5f |
| gate.mode | 0.000 | EEFET3.vdelt | 321.5m | EFFET3.c11th | 191.8f |
| drain.mode | 0.000 | EEFET3.vch | 1.000 | EEFET3.vinfl | −2.202 |
| source.mode | 0.000 | EEFET3.vsat | 2.051 | EEFET3.deltgs | 4.380 |
| g.z. | 11.87 | EEFET3.vgo | −1.892 | EEFET3.deltds | 400.0m |
| g.l | 1.998m | EEFET3.vdso | 3.000 | EEFET3.lambda | 20.00m |
| g.v | 1.000 | EEFET3.vco | 10.00 | EEFET3.cl2sat | 81.46f |
| d.z | 6.574 | EEFET3.mu | 0.000 | EEFET3.cgdsat | 28.12f |
| d.l | 1.000m | EEFET3.vba | 1.00 | EEFET3.kbk | 30.00m |
| d.v | 1.000 | EEFET3.vbc | 1.000 | EEFET3.vbr | 25.00 |
| s.z | 50.00 | EEFET3.deltgm | 0.000 | EEFET3.nbr | 2.000 |
| s.l | 0.000 | EEFET3.deltgmac | 0.000 | EEFET3.idsoc | 1.893 |
| s.v | 1.000 | EEFET3.alpha | 1.000m | EEFET3.ris | 119.8 |
| fet.ugw | 1.000 | EEFET3.gmmaxac | 25.66 | EEFET3.rid | 1.000m |
| fet.n | 1.000 | EEFET3.gammaac | 18.92m | EEFET3.tau | 2.500p |
| EEFET3.rg | 1.039 | EEFET3.kapaac | 66.67m | EEFET3.cdso | 115.5f |
| EEFET3.rd | 1.431 | EEFET3.peffac | 4.092 | EEFET3.ugw | 1.000 |
| EEFET3.rs | 1.405 | EEFET3.vtoac | −3.238 | EEFET3.ngf | 1.000 |
| EEFET3.Is | 2.419p | EEFET3.vtsoac | −100.0 | EEFET3.kmod | 103.0 |
| EEFET3.n | 1.190 | EEFET3.vdeltac | 173.7m | EEFET3.kver | 1.000K |

TABLE III

Final Extracted values for the NEC-9004-74 HP EEFet3 Model

| VARIABLE | VALUE | VARIABLE | VALUE | VARIABLE | VALUE |
|---|---|---|---|---|---|
| 1g.1 | 394.6p | EEFET3.gmmax | 227.4m | EEFET3.rdb | 1.000G |
| 1d.1 | 800.0p | EEFET3.gamma | 15.26m | EEFET3.obs | 160.0f |
| 1s.1 | 27.10p | EEFET3.kapa | 33.33m | EEFET3.gdbm | 200.0u |
| cxgd.c | 0.000 | EEFET3.peff | 22.00 | EEFET3.kdb | 100.0 |
| cxds.c | 0.000 | EEFET3.vto | −5.037 | EEFET.vdsm | 100.0 |
| cxgs.c | 0.000 | EEFET3.vtso | −100.0 | EFFET3.c110 | 5.432p |
| gate.mode | 0.000 | EEFET3.vdelt | 191.5m | EFFET3.c11th | 3.101p |
| drain.mode | 0.000 | EEFET3.vch | 1.000 | EEFET3.vinfl | −3.833 |
| source.mode | 0.000 | EEFET3.vsat | 1.471 | EEFET3.deltgs | 10.07 |
| g.z. | 100.0 | EEFET3.vgo | −2.807 | EEFET3.deltds | 393.2m |
| g.l | 2.024m | EEFET3.vdso | 3.000 | EEFET3.lambda | 5.850m |
| g.v | 1.000 | EEFET3.vco | 10.00 | EEFET3.cl2sat | 227.2f |
| d.z | 4100 | EEFET3.mu | 0.000 | EEFET3.cgdsat | 201.6f |
| d.l | 1.000m | EEFET3.vba | 1.00 | EEFET3.kbk | 30.00m |
| d.v | 1.000 | EEFET3.vbc | 1.000 | EEFET3.vbr | 25.00 |
| s.z | 50.00 | EEFET3.deltgm | 0.000 | EEFET3.nbr | 2.000 |
| s.l | 0.000 | EEFET3.deltgmac | 0.000 | EEFET3.idsoc | 1.893 |
| s.v | 1.00 | EEFET3.alpha | 1.000m | EEFET3.ris | 10.00m |
| fet.ugw | 1.000 | EEFET3.gmmaxac | 100.6m | EEFET3.rid | 1.000m |
| fet.n | 1.000 | EEFET3.gammaac | 13.67m | EEFET3.tau | 2.500p |
| EEFET3.rg | 500.0m | EEFET3.kapaac | 66.67m | EEFET3.cdso | 1.461p |
| EEFET3.rd | 200.0m | EEFET3.peffac | 26.43 | EEFET3.ugw | 1.000 |
| EEFET3.rs | 100.0m | EEFET3.vtoac | −6.201 | EEFET3.ngf | 1.000 |
| EEFET3.Is | 4.576p | EEFET3.vtsoac | −100.0 | EEFET3.kmod | 103.0 |
| EEFET3.n | 1.134 | EEFET3.vdeltac | 383.0m | EEFET3.kver | 1.000K |

Figure 7A:
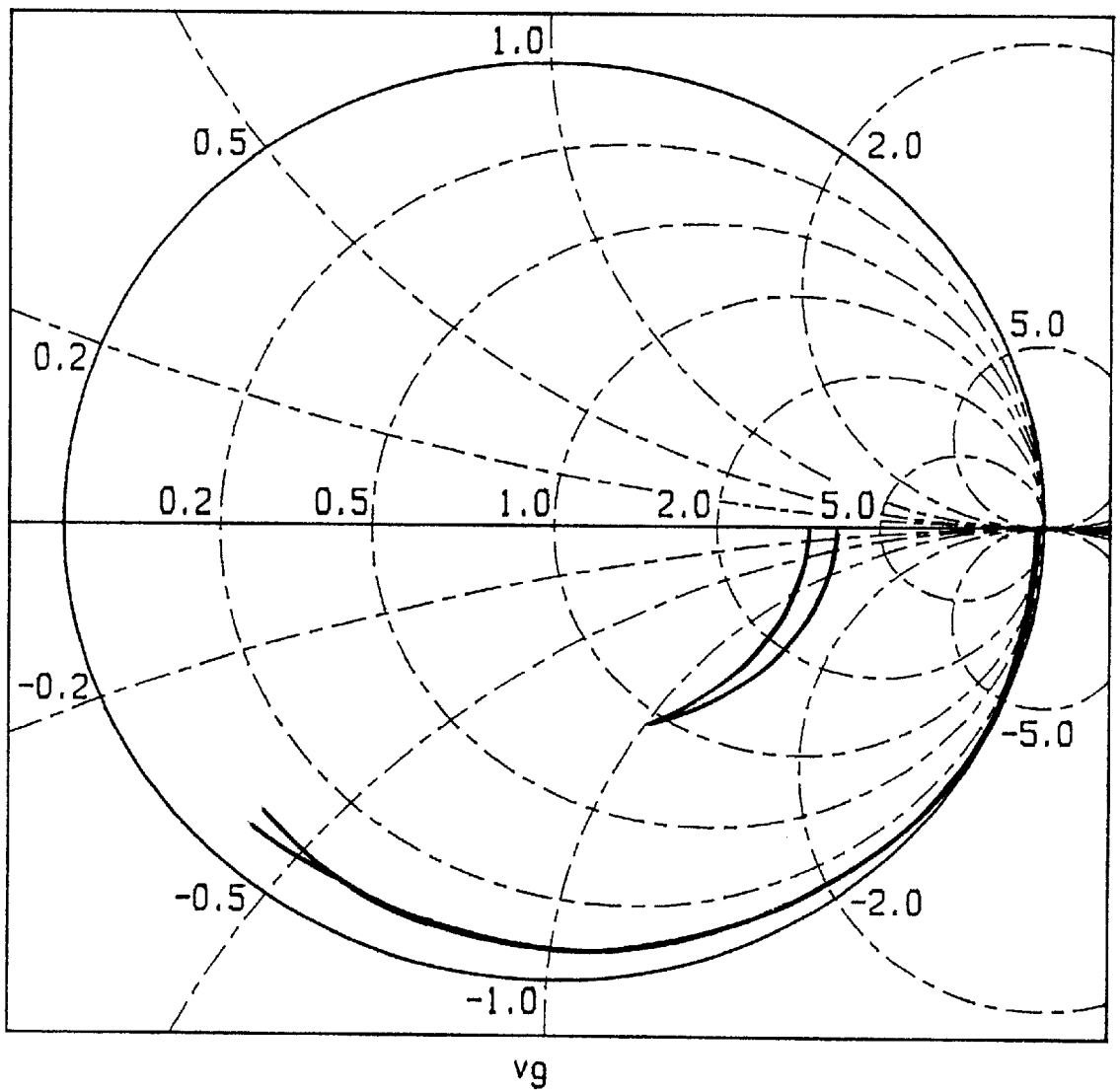
FIG. 7a shows an example of simulated and measured S-parameter values for one of the NEC-900X-XX Hp Eefet3 models.

FIG. 7a shows typical simulated and measured S-parameters of the NEC -9001-75, 9002-75, and 9004-74 models.

Figure 7B:
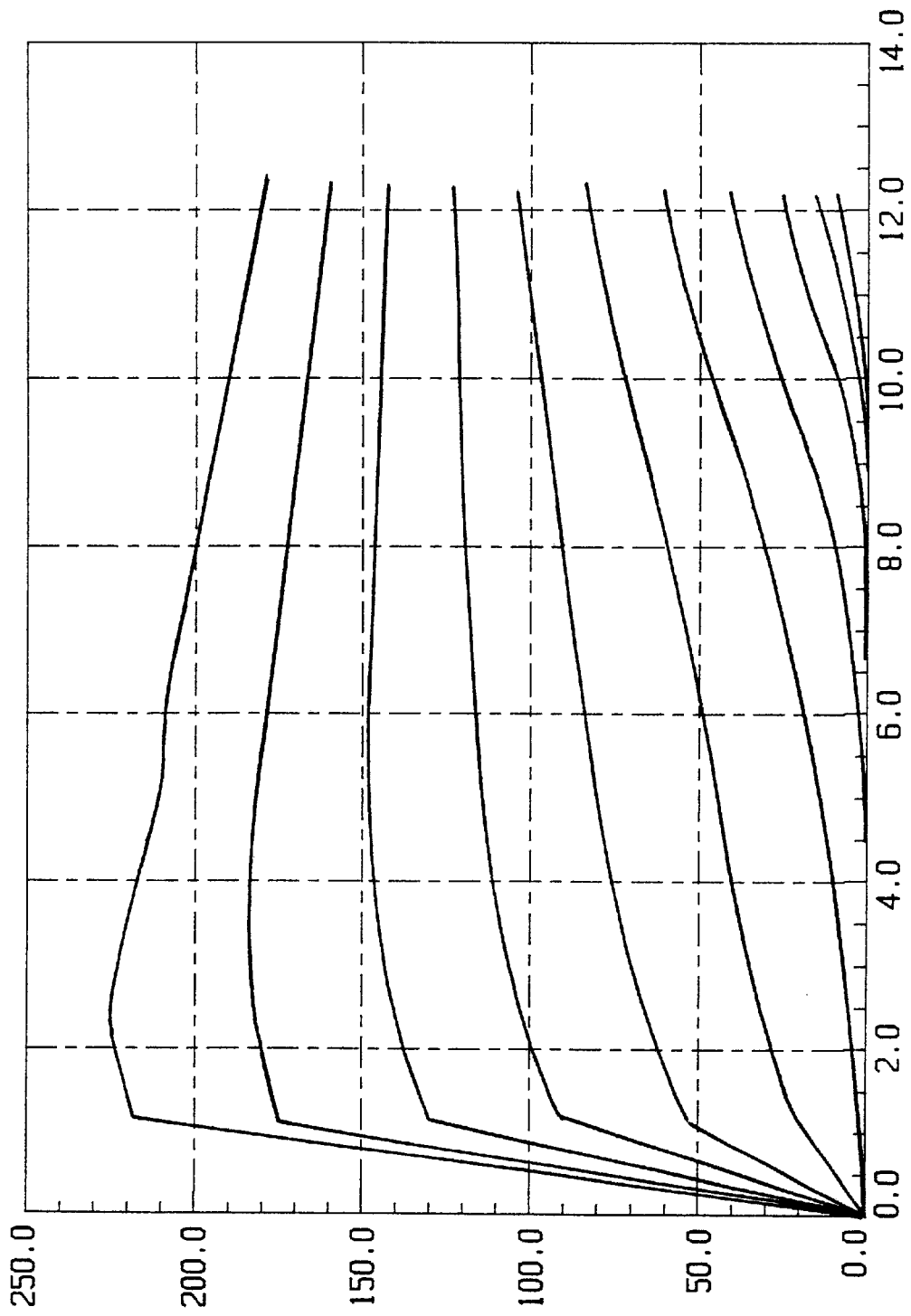
FIG. 7b is a graph showing the device pinch off voltages increasing as higher drain voltage levels are reached.

As shown in FIG. 7b, the device pinch-off voltage increases as the higher drain voltage levels are reached.

One problem with the HP EEFet3 model is that the non-linear kernel uses a square law relationship for the pinch off region, which is not similar to actual operation of the amplifier. In the HP EEFet3 model, a certain pinch off voltage may result that makes either the current or transconductance zero, but not both. Actual devices are more accurately modeled by a quadratic relationship.

From the measurements in this configuration, the values of Vdelt, Gamma, EEFet3.vdelt, EEFet3.vsat and EEFet3.vg0 are found through iterative DC simulations. Vdelt and EEFet.vdelt are the parameters that control the linearization point for transconductance characteristics, Gamma is the Vds-dependent threshold parameter, EEFet3.vsat is a drain-source current saturation parameter; and EEFet3.vg0 is the gate-source voltage where transconductance is a maximum.

(First to Third Stage Analyses Based on Models)

The Models derived from the above steps are then used in the simulation of High Efficiency Microwave Amplification (HEMPA) topology.

In particular, a new type of analysis, which is a harmonic-balance method, is used for non-linear d.c., non-linear transient and linear a.c. analyses.

The harmonic-balance method is iterative in nature and is based on the assumption that for a given sinusoidal excitation there exists a steady state solution that can be approximated to a desired degree of accuracy using a finite Fourier series.

As the solution is postulated in the form of a finite Fourier series, the circuit node voltages take on a set of amplitudes and phases for all frequency components.

The currents which flow from nodes into linear elements, including all distributed elements, are calculated by a straightforward frequency domain linear analysis. Currents from The currents which flow from nodes into non-linear elements are calculated in the time-domain. Generalized Fourier analysis is used to transform from the time domain to the frequency domain.

A multi-step approach is used in this analysis to verify several key issues specific to a microwave high efficiency power amplifiers.

The first issue specific to microwave high efficiency power amplifiers is an efficient method for converting the sinewave R/E signal to a square-wave. Normally either saturation of a stage or some type of diode limiter type topology is used. Once the waveform is converted accurate amplification of the signal can proceed.

The second issue is the improvement of the input Voltage Wave Standing Ratio (VSWR). Since the amplifier is in either cut-off or saturation, the input impedance varies dramatically between these two extremes. A circulator can be optionally added to the input section to allow a more accurate impedance matching.

The first topology that will be simulated uses perfect components in regard to frequency response, with the exception being transistor models. As the analysis continues the original (perfect) components are replaced with more accurate components in terms of response.

First (Input) Stage Analysis

In this embodiment, the first stage is comprised of two NEC-9001-75 GaAs FETs biased in a Class-D arrangement and a transponder receiver/exciter (R/E) signal. This amplifies R/E signal is variable anywhere from −10 dBm to +10 dBm into a 50 ohm load.

FIG. 8 shows an example of a microwave circulator. The circulator is one way to reduce the VSWR, but at a loss of input power. The circulator operates such that a signal input at port 1 is passed to port 2 but not to port 3. However, any signal input from port 2 is passed to port 3 but not to port 1. By such design, any reflected power from port 2 due to a mismatch is not seen by port 1, and thus a low VSWR is achieved.

A new type of power divider/combiner topology, is connected in both the input and output sections of the amplifier. Although the output waveform is still sinusoidal in nature, the use of push-pull stage generates high power output and lends itself to the divider/combiner topology.

The new type of combiner/splitter takes the signal and generates two signals of equal amplitude but opposite phase. According to this new type of topology, the requirement of constant phase delay of the divider must be some multiple of $\lambda/2$ in total length, rather than $\lambda/4$. The reason that the divider must be some multiple of $\lambda/2$ rather than $\lambda/4$ is that all the odd harmonic frequencies are only in phase at $\lambda/2$ and $\lambda$ (which is a multiple of $\lambda/2$).

In contrast, if the total length of the divider is a multiple of $\lambda/4$, the harmonic phase difference relative to the fundamental varies as follows: the fundamental waveform would traverse a length of $\lambda/4$. The third harmonic, traveling the same distance, would traverse 3 $\lambda/4$, since the third harmonic is three times of the fundamental frequency and the resultant phase difference would be 180 degrees. The fifth harmonic would travel 5 $\lambda/4$, or $\lambda/4$ and thus would be in phase with the fundamental frequency. Thus the phasing between the harmonics would oscillate between being in-phase and 180 degrees out of phase.

Figure 9B:
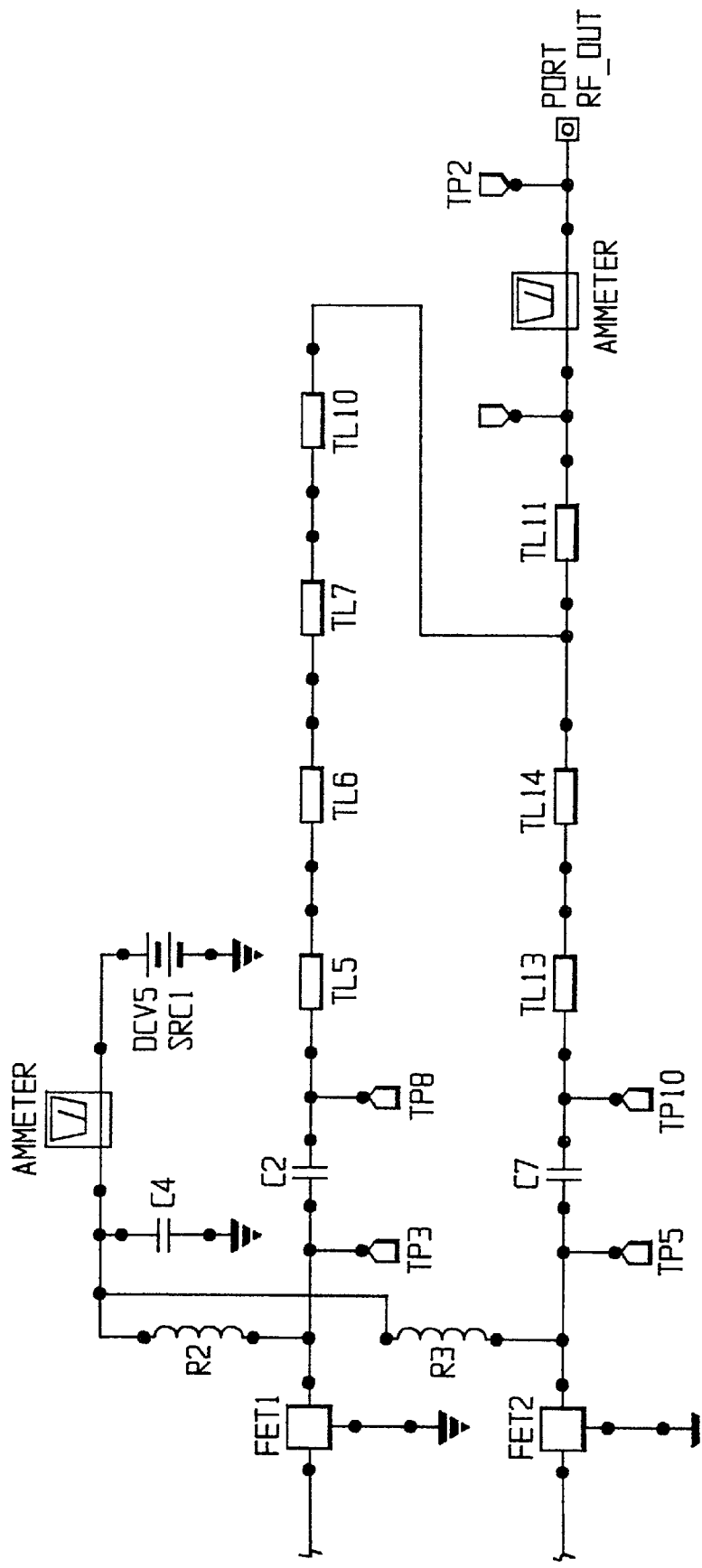

FIG. 9 illustrates an example of a first stage analysis using perfect transmission lines, resistors, capacitors, and a circulator, as well as negative feedback to aid in the impedance input matching.

The final components, and parameter values of the amplifier stage are the drain and gate voltages, SrC1 and SrC2, respectively, as well as the RF chokes and bypass capacitors L2, L3, L5, L6, C3 and C4, respectively.

In the embodiment, after numerous simulations to arrive at the optimum performance, the overall RF gain from the stage was 15.4 dB with an input VSWR of 1.0024:1. The DC-to-RF conversion, also known as ń, was 67.2 percent and the Power Added Efficiency (PAE) is 65.2 percent. The PAE is defined as the RF output power minus the RF input power divided by the DC input power.

Figure 10:
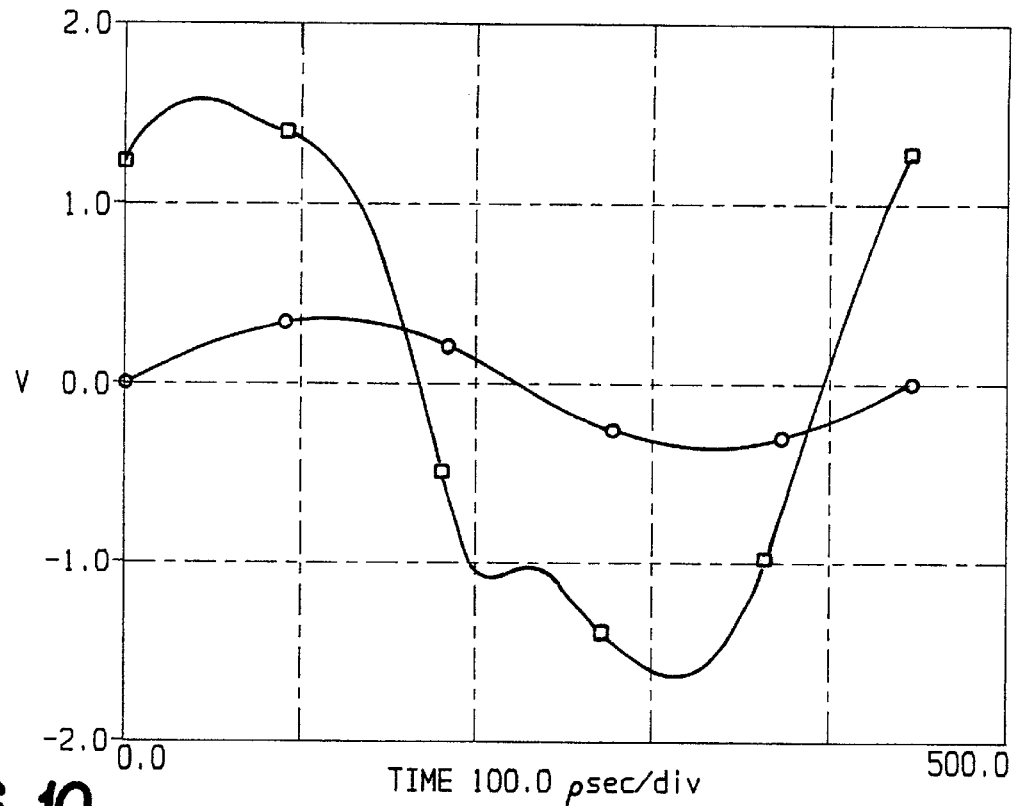
FIG. 10 is a graph showing the input and output waveforms of the first stage of the amplifier.

FIG. 10, shows both the input and output signals. With such high efficiency, Class D operation in the microwave region is practical. It is understood by persons of ordinary skill in the art that as the perfect components are replaced with models that are more realistic, the efficiency is degraded somewhat. To accurately model the capacitors and the inductor, the quality (Q), equivalent series resistance (ESR), and resonant frequency were used. From the manufacturer's specification sheet, the Q, ESR and resonant frequency ($F_r$) are all value dependent. This dependence, on a log vs. log plot is linear below resonance. The best-fit equations for each type of capacitor and inductor was determined by using curve fitting routines.

Figure 12:
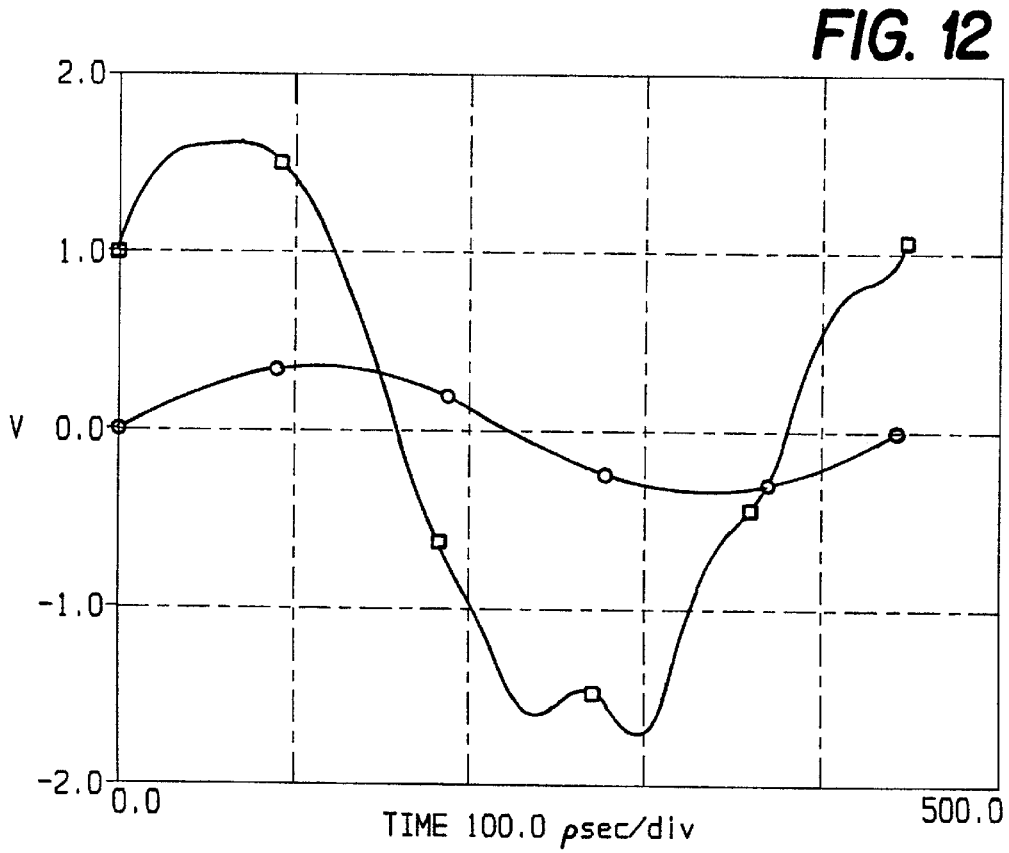
FIG. 12 is a graph illustrating the square wave characteristics desired in the HEMPA design.
Figure 11:
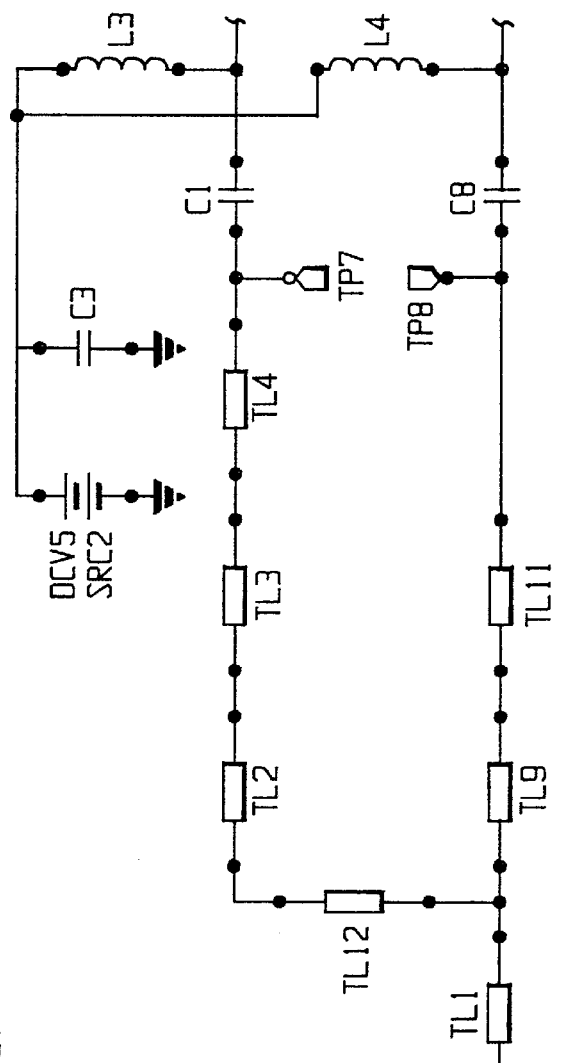
FIG. 11 is a graph showing a typical plot of Q vs. Frequency.

FIG. 11 shows a typical plot of Q vs. Frequency for one type of inductor being used. As the component values changed, the Q, ESR and $F_r$ were automatically updated as well. After hundreds of iterations to the optimized first stage amplifier, the overall RF gain from the first stage was 13.3 dB with an input VSWR of 1.0024:1. The DC-to-RF conversion was 54.2 percent, and the PAE was 51.7 percent. The reduction in efficiency from replacing perfect transmission lines with the microstrip was less than 10 percent. FIG. 11 shows the RF input and output waveforms generated by the power amplifier, and FIG. 12 illustrates the square wave characteristics desired in the HEMPA design.

(Second (Driver) Stage Analysis)

The driver stage is comprised of two NEC-9002-75 GaAs FETs biased in a Class-D arrangement and amplifies the signal from the first stage. The input signal can vary anywhere from 0 to +20 dBm into a 50 ohm load. By providing a Class-D biasing arrangement, higher efficiency and a maximum gain are possible with little additive noise.

Figure 13A:
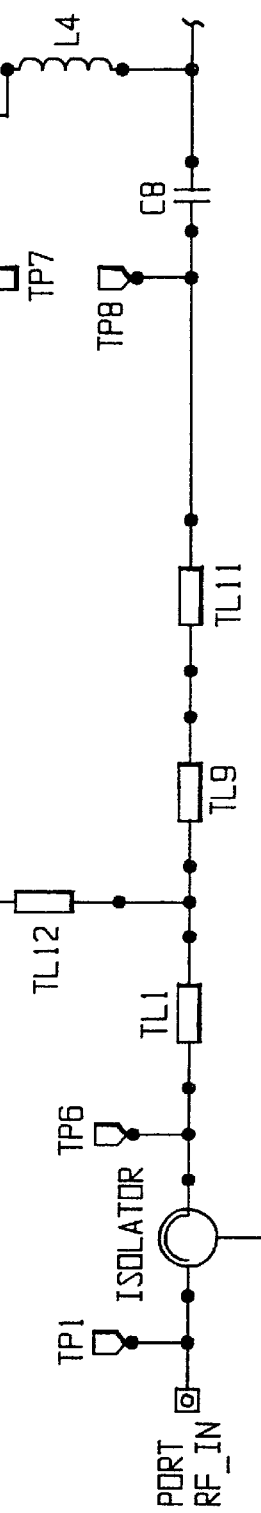
FIGS. 13a–13b show an example of a new type of power divider/combiner topology used in both the input and output sections of the amplifier.
Figure 13B:
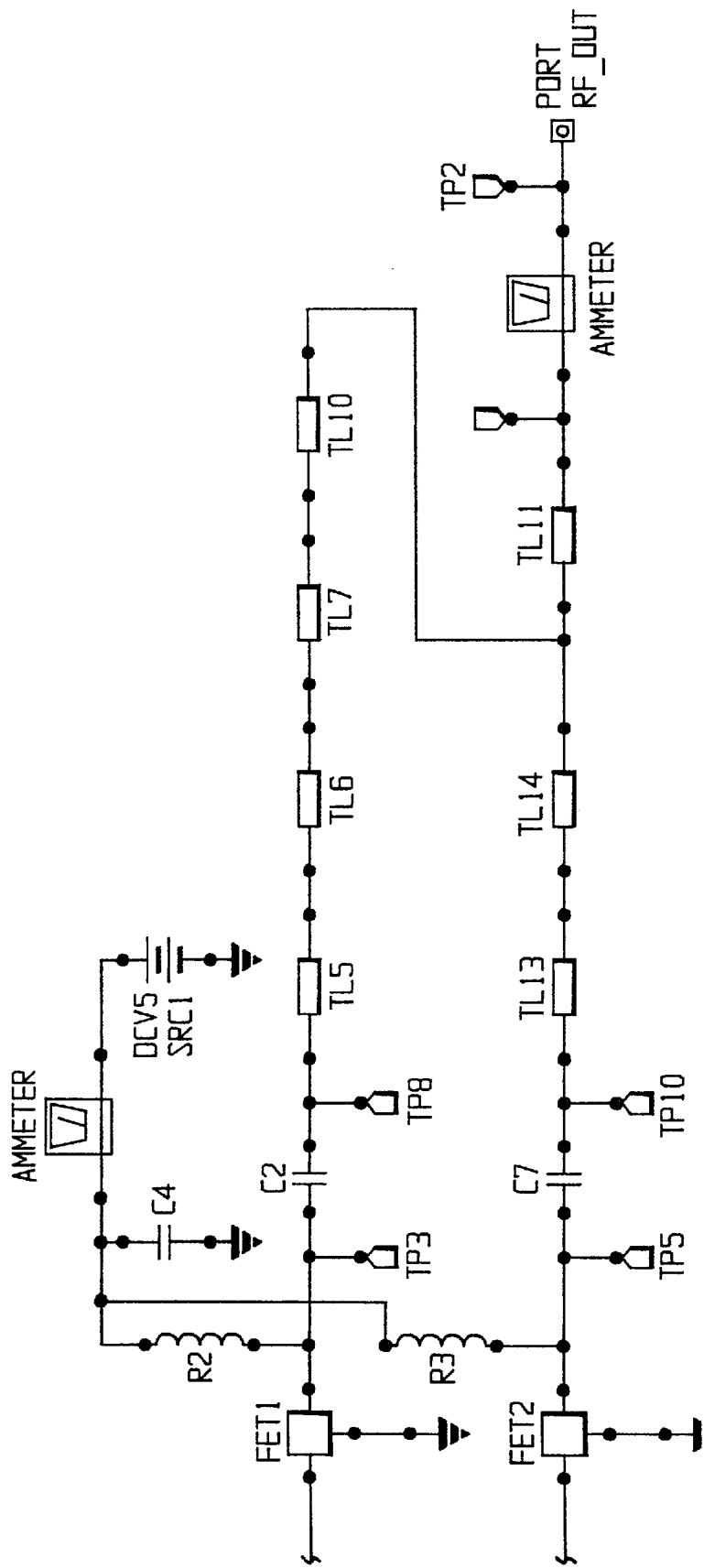

As shown in the respective halves in FIGS. 13a and 13b, the new type power divider/combiner topology previously described was used in both the input and output sections of the amplifier.

After numerous simulations to arrive at the optimum performance, the overall RF gain was 8.5 dB from the first stage with an input VSWR of 4.3:1. The DC-to-RF conversion, ń, was 52.7 percent and the PAE was 45.3 percent.

Figure 13C:
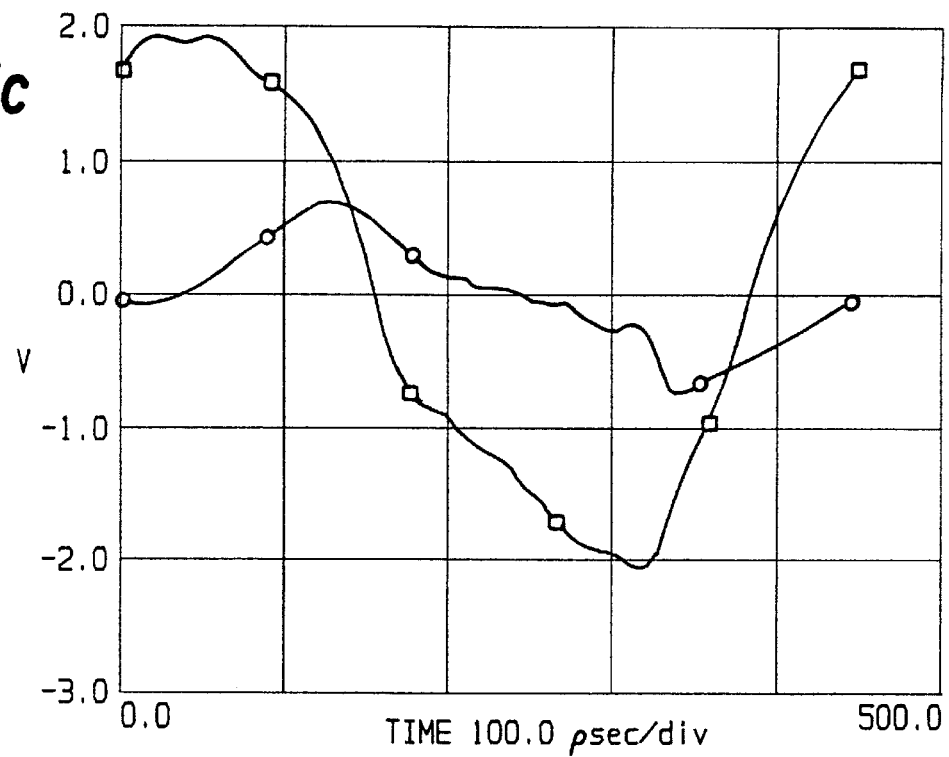
FIG. 13c is a graph showing the input and output signals from the amplifier in the second stage.

FIG. 13c shows the input and output signals from the amplifier. The perfect transmission lines shown in FIGS. 13a and 13b were then replaced with the harmonically rich divider/combiner topology utilizing microstrip transmission lines. The microstrip transmission lines are simulated such that the losses associated with the board material are taken into account. As will be shown, the losses with the microstrip traces are taken into account the efficiency of the overall amplifier will be affected.

Figure 13D:
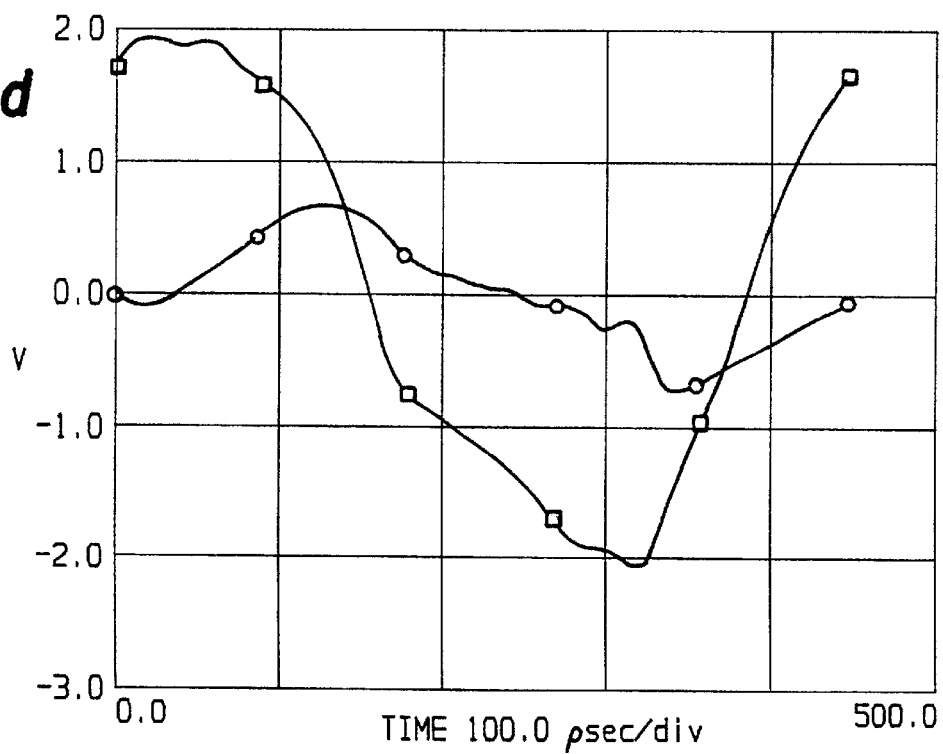
FIG. 13d is a graph showing both the input and output RF signals from the second stage after successive iterations.

FIG. 13d shows both the input and output RF signals from the amplifier (second) stage. After numerous simulations to arrive at the optimum performance, the overall RF gain was 8.0 dB from the first stage with an input VSWR of 1.6:1. The DC-to-RF conversion, was 41.9 percent and the PAE was 35.0 percent.

For comparison, the PAE for the perfect transmission line topology was 45.3 percent, ń was 52.7 percent, and the overall gain of the amplifier was 8.5 dB, which is a slight difference in the performance. Upon closer inspection, it can be seen that there is a slight squaring of the signal, indicative of the increase in efficiency.

Subsequently, the next step is to replace the values of perfect resistors, inductors, and capacitors with realistic RLC equivalent components. The realistic components are subject to resonances and power losses due to the Q, or quality, of the components.

Figure 14A:
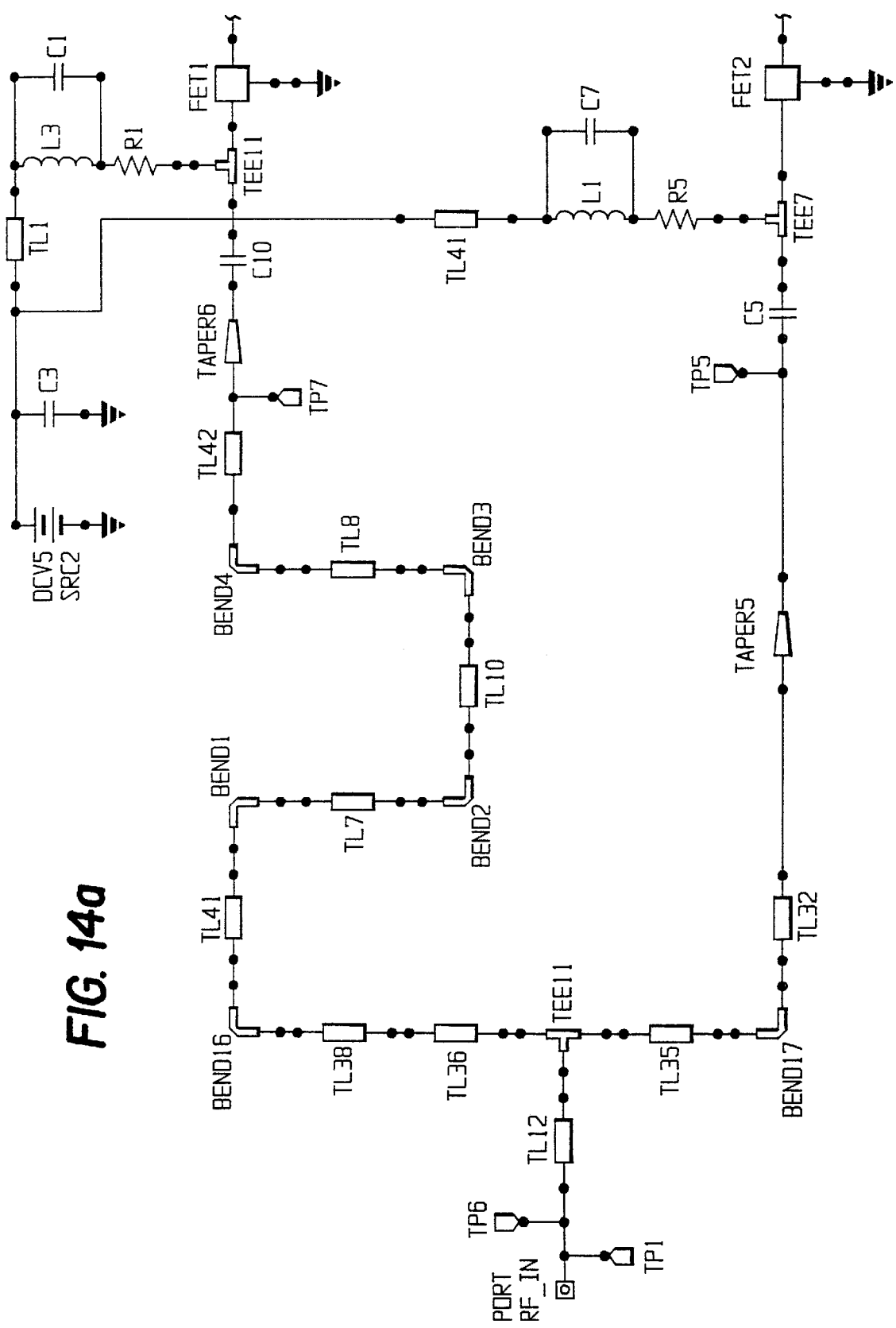
FIGS. 14a–14b show respective halves of the second stage (i.e. driver stage).
Figure 14B:
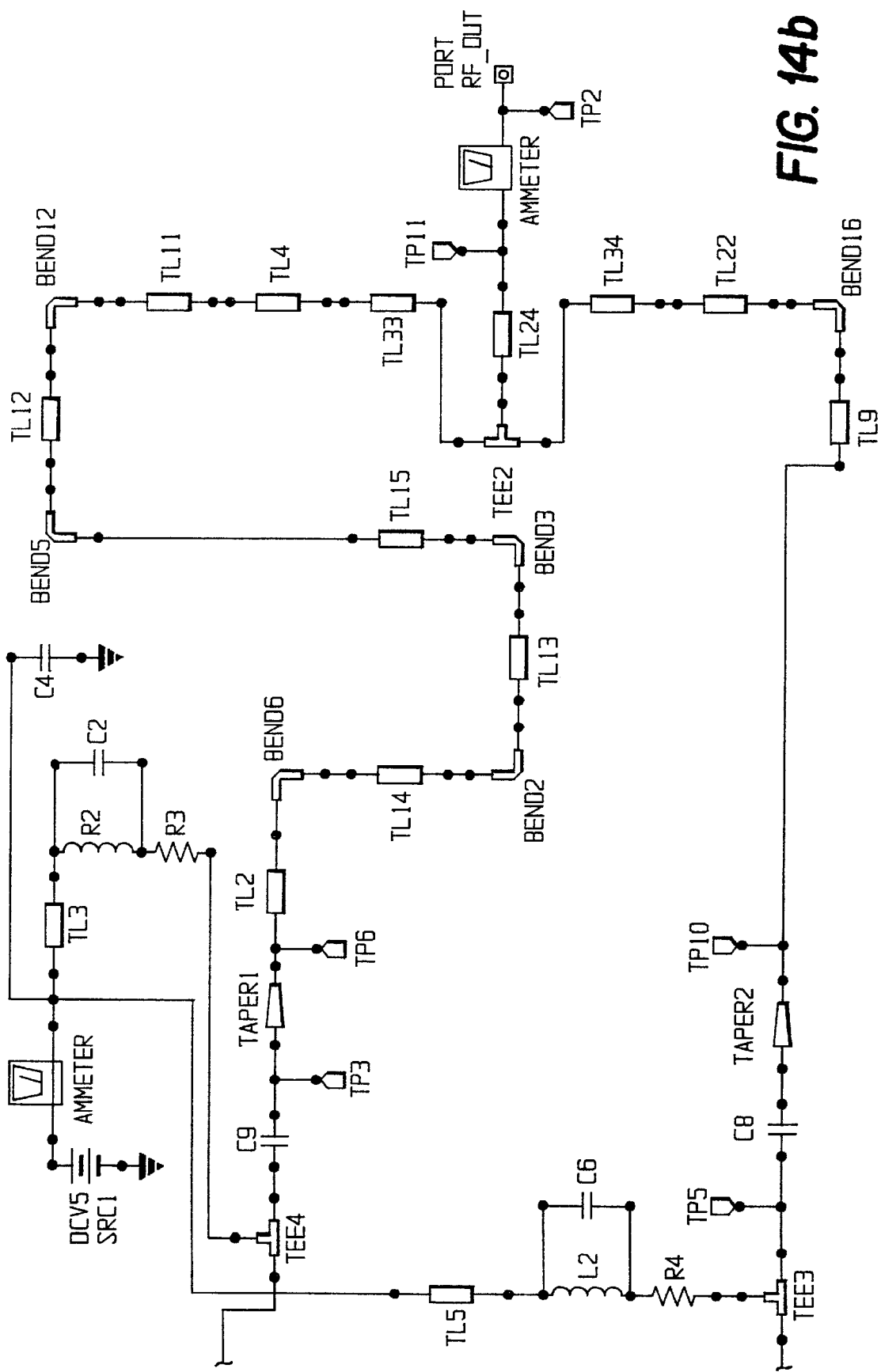
Figure 14C:
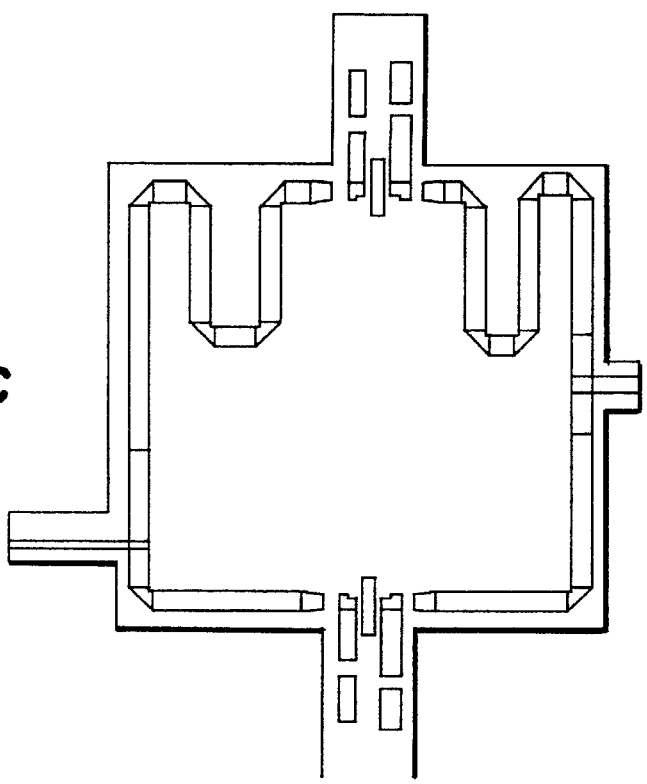
FIG. 14c shows the final breadboard layout of the second stage of the S-Band Class D Amplifier.
Figure 16D:
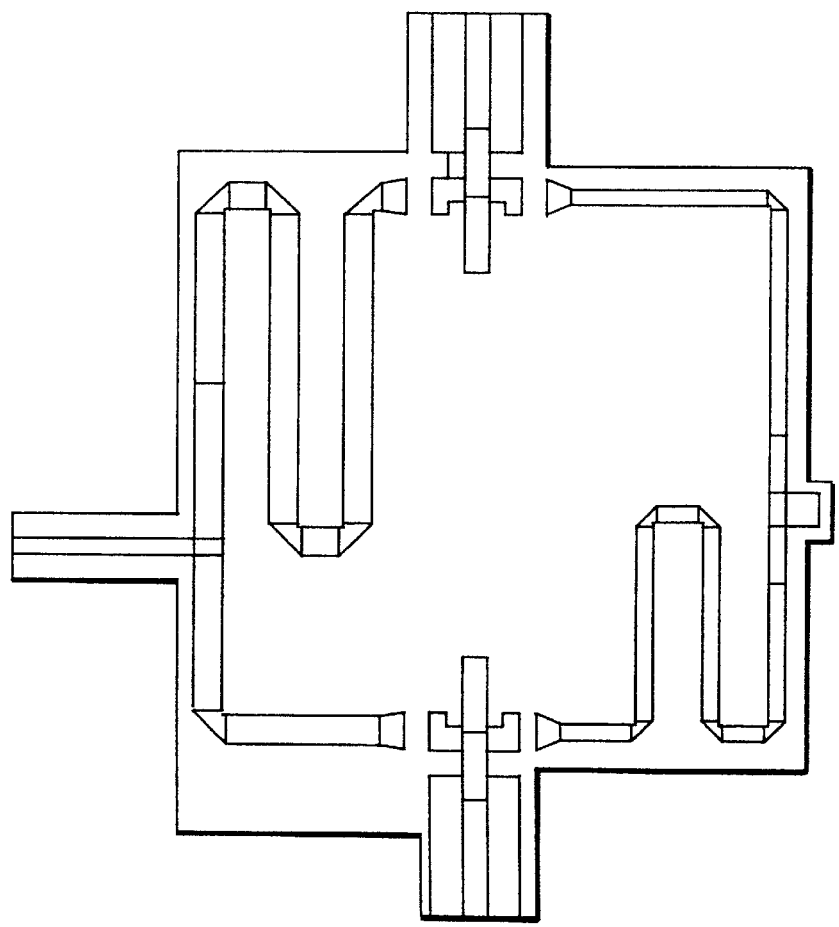
FIG. 16d shows the final breadboard layout of the third stage of the S-Band Class D Amplifier.

The final version is shown in respective halves in FIGS. 14a and 14b. The final breadboard layout is shown in FIG. 14c.

After numerous iterations were performed to optimized the driver stage amplifier, the following results were achieved. The overall RF gain from the second stage was 8.8 dB with an input VSWR of 1:9:1. The DC-to-RF conversion was 42.6 percent, and the PAE was 36.9 percent. For comparison, the change in efficiency from perfect transmission lines to microstrip was approximately 10 percent.

Figure 15:
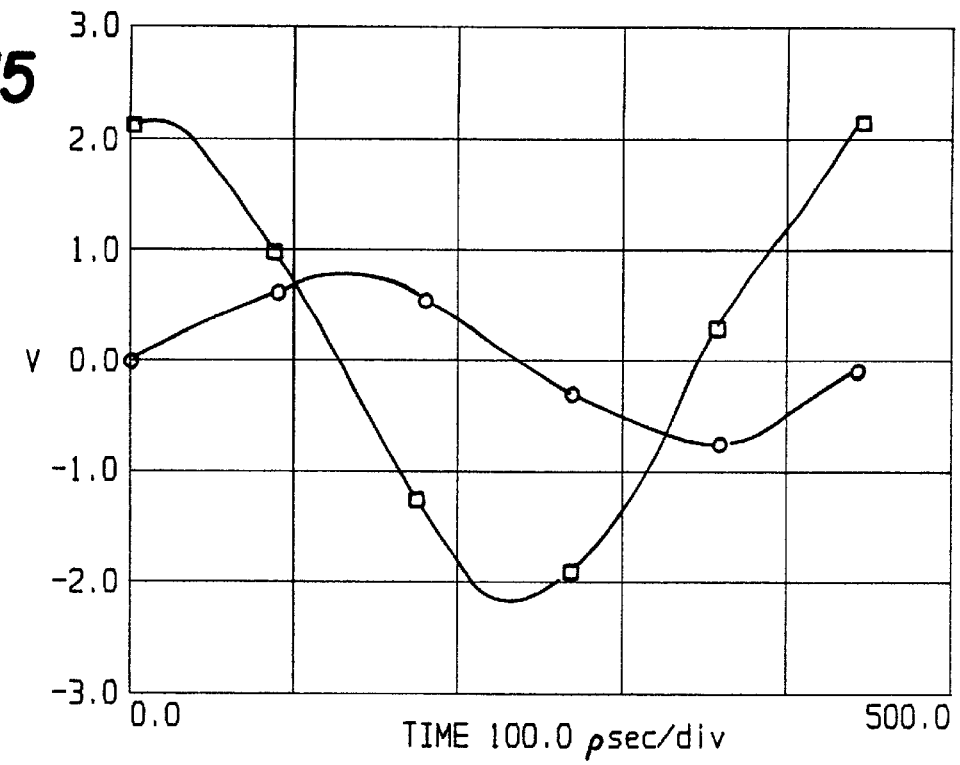
FIG. 15 is a graph showing the RF input and output waveforms generated by the power amplifier.

FIG. 15 shows the RF input and output waveforms generated by the power amplifier.

(Third (Final) Stage Analysis)

The third or final stage is comprised of two NEC-9004-74-GaAs FETs biased into a Class-D arrangement and amplifies the signal from the second (driver) stage. The input signal can vary anywhere from +10 to +30 dB m into a 50 ohm load.

Similar to the first two stages, the analysis starts with values for perfect transmission lines, resistor, inductors, capacitors, and a circulator, to aid in the imput impedance matching. In addition, the new type of power divider/combiner topology, which was discussed in the first stage analysis, was used in both the input and output sections of the amplifier.

The perfect transmission line is then replaced with the harmonically rich divider/combiner topology. Thus, the microstrip transmission lines are simulated such that the losses associated with the board material are taken into account.

After numerous simulations to arrive at the optimum performance, the overall RF gain from this stage was 11.2 dB with an input VSWR of 33:1. The DC-to-RF conversion was 63.2 percent and the PAE was 58.1 percent.

Figure 16A:
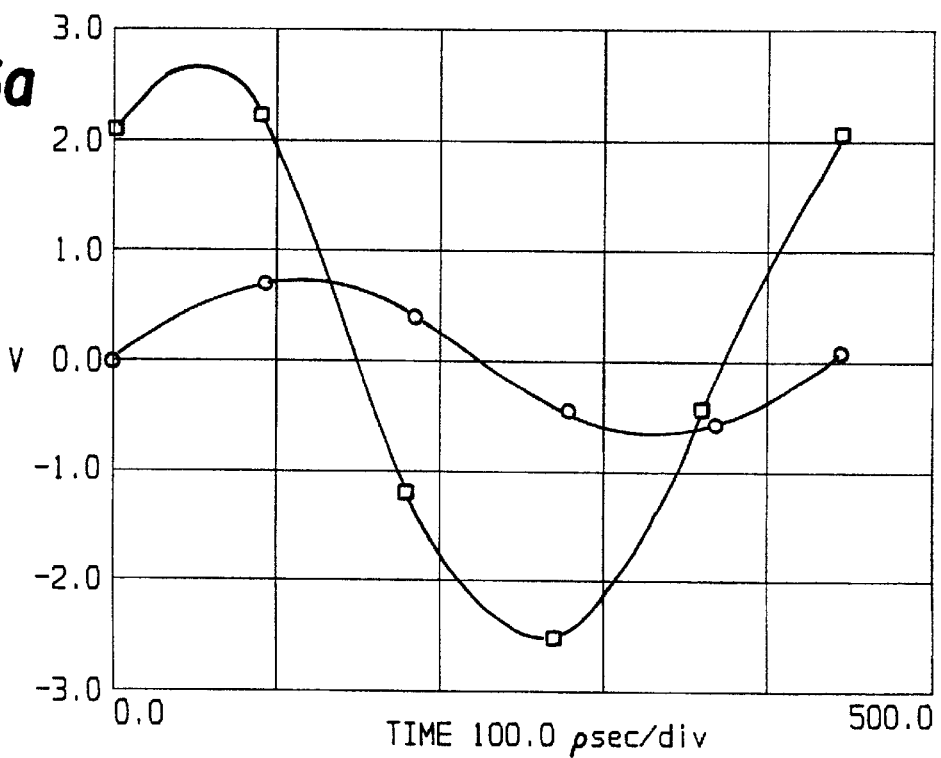
FIG. 16a is a graph showing both the input and output RF signals from the third stage (i.e. final stage).

FIG. 16a shows both the input and output RF signals from the third stage. It can be seen that the output waveform is starting to look like a square wave, providing additional proof that increased microwave power amplifier efficiency can be accomplished using current state-of-the-art microwave power transistors.

The next step is to replace the perfect resistors, inductors and capacitors with realistic RLC equivalent components. The realistic components are subject to resonances and power losses due to the Q, or quality, of the components.

Figure 16B:
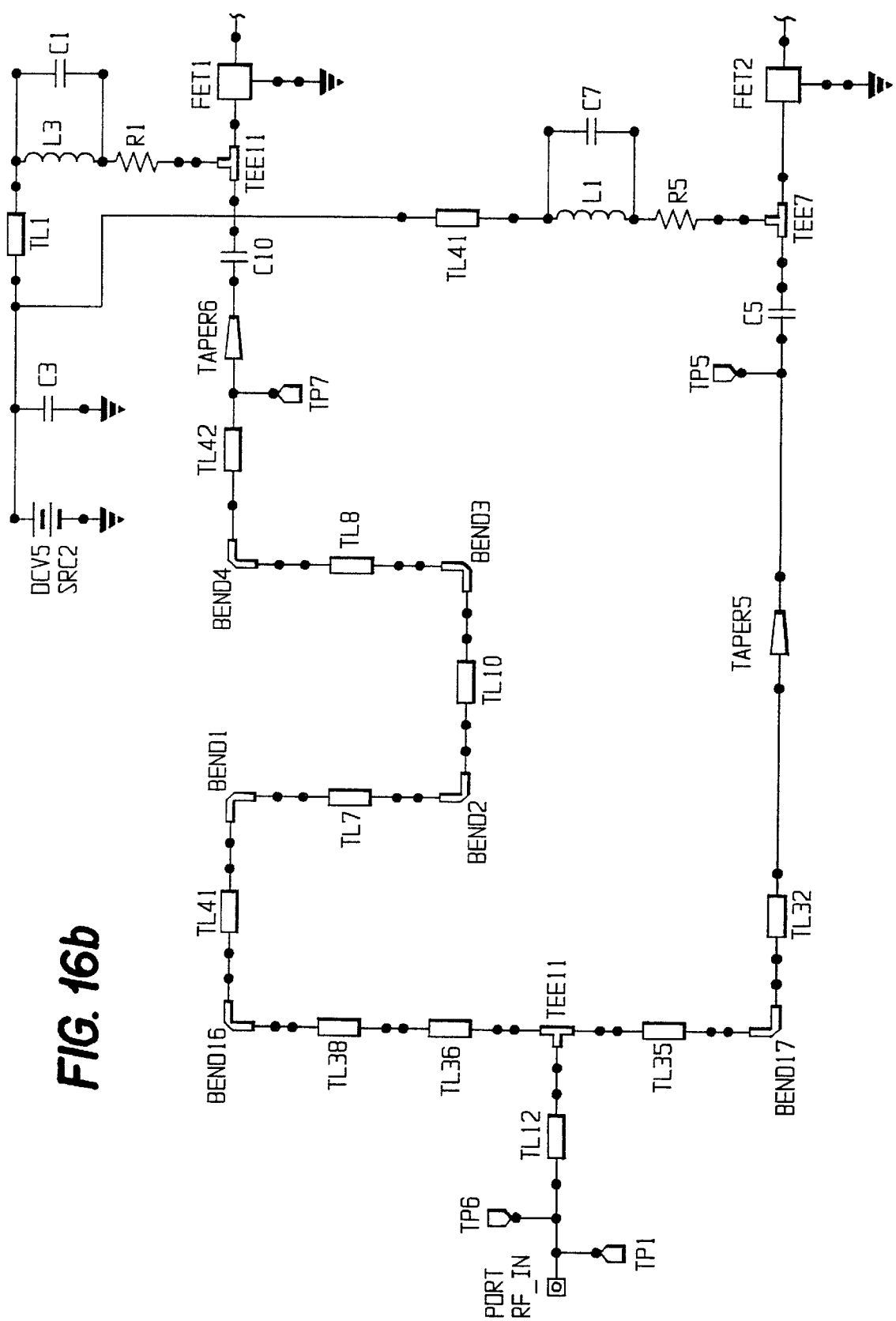
FIGS. 16b and 16c show respective halves of the final version of the Class-D Amplifier.
Figure 16C:
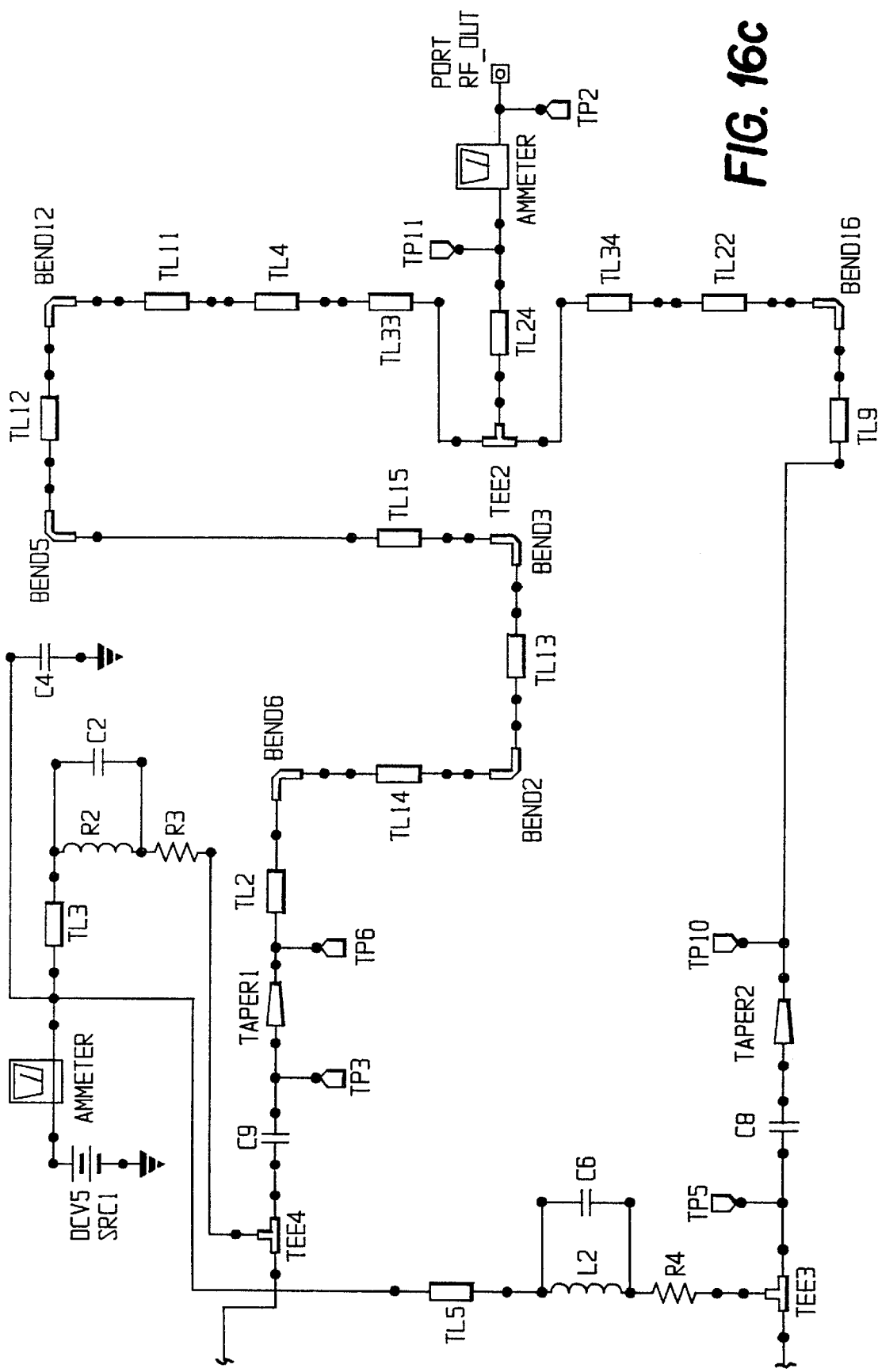

FIG. 16b shows the final version of the Class-D amplifier, where all the components are represented by realistic values and losses. FIG. 16c shows the final breadboard layout.

After numerous iterations were conducted in order to optimize the final stage amplifier, the overall RF gain from this stage was 9.7 dB with an input VSWR of 10:1. The DC-to-RF conversion was 57.7 percent, and the PAE was 51.6 percent.

Figure 17:
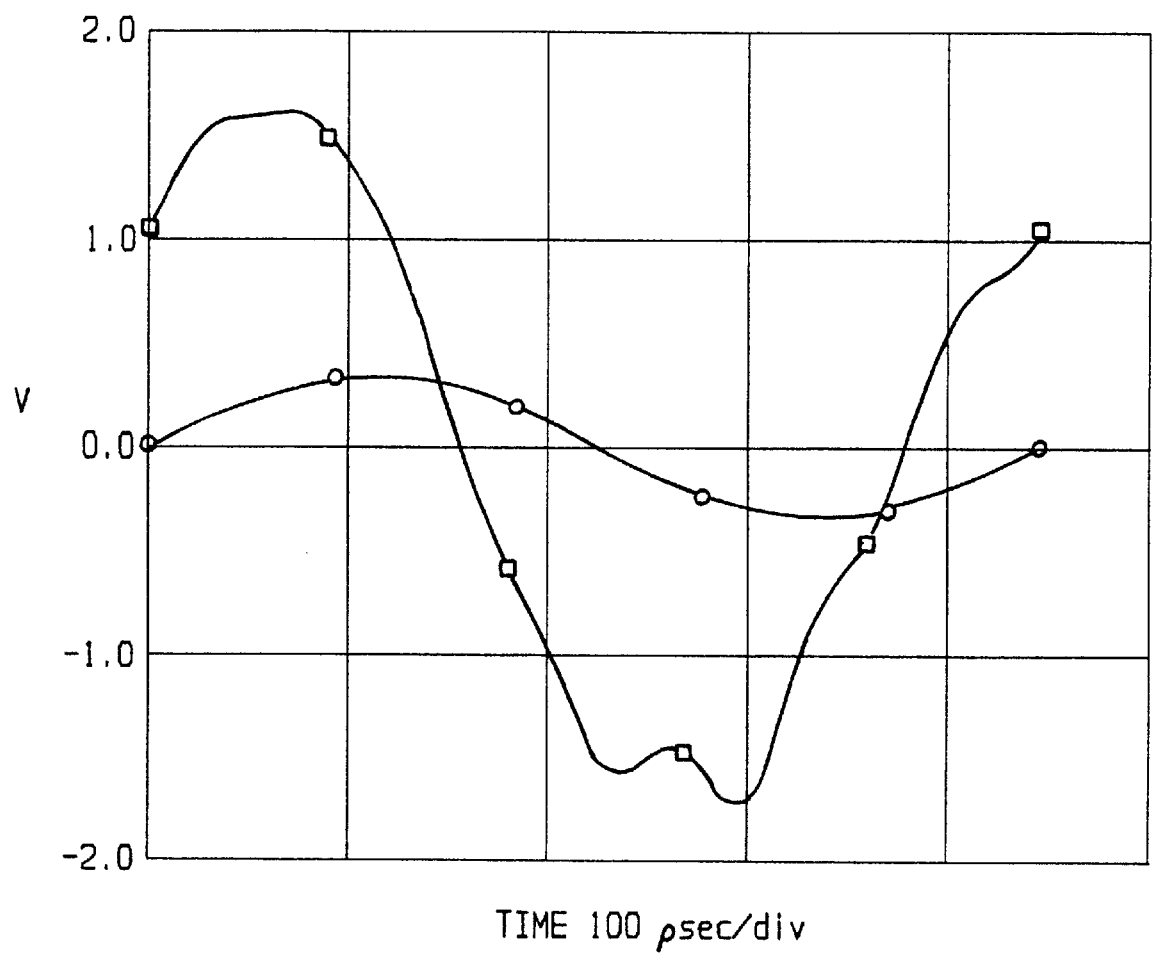
FIG. 17 is a graph showing the RF input and output waveforms generated by the power amplifier in the third stage.

FIG. 17 shows the RF input and output waveforms generated by the power amplifier. As can be seen in FIG. 17, the output waveform is exhibiting the square wave characteristics inherent in the HEMPA design.

Table IV shows inter-stage results and comparisons of the input stage, driver stage, and final stage.

TABLE IV

HEMPA Inter-stage Results and Comparisons

| MEASUREMENT | INPUT STAGE | DRIVER | FINAL |
| --- | --- | --- | --- |
| Input VSWR | 1.0023:1 | 1.9:1 | 33:1 |
| Gain (dB) | 13.3 | 8.8 | 9.6 |
| DC-to-RF Efficiency (%) | 54.2 | 42.6 | 58.6 |
| Power Added Efficiency (%) | 51.7 | 36.9 | 52.2 |

As can be seen by the values in Table IV, the input VSWR, Gain DC-to-RF Efficiency and Power Added Efficiency values show that good efficiency can be achieved in the S-band, which was unknown in the prior art.

A product of a HEMPA circuit by the above process is also within the scope of the claimed invention.

The equipment used for the simulation in this particular embodiment were the computer controlled HP4142B Modular Source/Monitor and the HP8753C S-Parameter Test Set, which is used to generate the operating linear S-parameters.

In addition, the NEC-9001-75, NEC-9002075, and NEC-9004-74 GaAs FET models and transistors were used. It is within the scope of the claimed invention for a person of ordinary skill in the art to use other types of modular source monitors, S-Parameter test sets and transistors. However, it is believed that the best mode known by the inventor to practice this invention is the embodiment described above.

What is claimed is:

1. A process for providing a High Efficiency Microwave Power Amplifier (HEMPA) which propagates a microwave frequency square wave, wherein said method utilizes a circuit simulation program for simulating Field Effect Transistors (FETs) at high DC-to-RF efficiencies, and comprises the steps of:

(a) analyzing response data of linear elements of a plurality of selected FETs in a frequency domain;

(b) analyzing response data of non-linear elements of the plurality of selected FETs in a time domain;

(c) converting the non-linear response data from the time domain obtained in step (b) into the frequency domain by using a Discrete Fourier Transform (DFT) of time domain values;

(d) performing a series of DC and S-parameter simulated measurements based on predefined data specific to each one of the selected FETs contained in the simulation program and from values obtained in steps (a) and (c);

(e) extracting and isolating individual device parameters of the selected FETs by converting the S-parameters to one of admittance and impedance parameters to derive FET models for each of the selected FETs;

(f) employing the FET models derived in step (e) in a simulated amplification circuit of the simulation program to provide a HEMPA circuit based on iterative simulations of the amplification circuit utilizing microwave topology at microwave frequencies, wherein the iterative simulations of the amplification circuit include analyzing output values of a plurality of cascaded stages of the selected FETs, and said cascaded stages including at least an input stage and an output stage of FETs, with each stage having FETs arranged in a push-pull configuration; and (g) receiving the final output of the HEMPA circuit from the simulation program after the iterative simulations provided in step (f) are a sufficient quantity to provide values of components for connection with the cascaded stages of FETs to provide said HEMPA circuit.

2. The process according to claim 1, wherein the FET models employed in step (f) includes a driver stage cascaded between said input stage and said output stage.

3. The process according to claim 1, wherein the iterative simulations are provided at microwave frequencies in the S-band region.

4. The process according to claim 2, wherein the iterative simulations are provided at microwave frequencies in the S-band region.

5. The process according to claim 2, wherein the push-pull configuration of FETs employed in step (f) in each of the cascaded stages are Class D amplifiers.

6. The process according to claim 1, wherein the extracting and isolating of the FETs to derive the models provided in step (e) comprises:

(1) previewing device operation by verifying a value of gate current ($I_g$) vs. a voltage from gate-to-source ($V_{gs}$);

(2) measuring a drain current ($I_d$) while sweeping a gate voltage the FETs;

(3) varying the drain current ($I_d$) with respect to drain voltages ($V_d$) at a plurality of values of gate voltage to obtain a Family of Curves;

(4) previewing source, drain, and gate resistances of the FETs by using a Yang-Long method;

(5) providing a final measurement of the resistances previewed in step (4) by the Yang-Long method;

(6) extracting intrinsic and extrinsic parasitics from S-parameter data;

(7) measuring ideality (I) of the FETs by measuring the gate voltage of the FETs while opening the drain of said FETs;

(8) measuring values of $V_g$ with $V_{ds}$ at a constant value of $V_{ds0}$;

(9) measuring $I_d$ vs. $V_d$ while varying $V_g$; and

(10) performing sweeping S-parameter measurements by sweeping a signal applied to the gate and measuring the S-parameters at the drain of the FETs.

7. The process according to claim 6, wherein the FET models employed in step (f) includes a driver stage cascaded between said input stage and said output stage.

8. The process according to claim 7, wherein the iterative simulations are provided at microwave frequencies in the S-band region.

9. The process according to claim 8, wherein the push-pull configuration of FETs employed in step (f) in each of the cascaded stages are Class D amplifiers, and further includes connecting a divider/combiner to providing is connected both said input and output stages having a length in multiples of λ/2 of a wavelength for an operating frequency of said amplifier.

10. The process according to claim 1, wherein the employing of FET models recited in step (f) includes for each respective stage:

(1) using ideal component values in regards to frequency response and power loss during initial iterative simulations in the simulation program; and (2) replacing the ideal component values recited in step (f) (1) with realistic values based on manufacturers specification of each respective component during latter iterative simulations so as to provide a more realistic response of said HEMPA circuit.

11. The process according to claim 2, wherein the employing of FET models recited in step (f) includes for each respective stage:

(1) using ideal component values in regards to frequency response and power loss during initial iterative simulations in the simulation program; and (2) replacing the ideal component values recited in step (f) (1) with realistic values based on manufacturers specification of each respective component during latter iterative simulations so as to provide a more realistic response of said HEMPA circuit.

12. The process according to claim 8, wherein the employing of FET models recited in step (f) includes for each respective stage:

(1) using ideal component values in regards to frequency response and power loss during initial iterative simulations in the simulation program; and (2) replacing the ideal component values recited in step (f) (1) with realistic values based on manufacturers specification of each respective component during latter iterative simulations so as to provide a more realistic response of said HEMPA circuit.

13. A high efficiency microwave power amplifier according to the process recited in claim 1.

14. A high efficiency microwave power amplifier according to the process recited in claim 2.

15. A high efficiency microwave power amplifier according to the process recited in claim 3.

16. A high efficiency microwave power amplifier according to the process recited in claim 4.

17. A high efficiency microwave power amplifier according to the process recited in claim 9.

18. A high efficiency microwave power amplifier according to the process recited in claim 10.

19. A high efficiency microwave power amplifier according to the process recited in claim 11.

20. A high efficiency microwave power amplifier according to the process recited in claim 12.

* * * * *